US009078385B2

(12) United States Patent
Kido et al.

(10) Patent No.: US 9,078,385 B2
(45) Date of Patent: Jul. 7, 2015

(54) COMPONENT MOUNTING METHOD AND COMPONENT MOUNTING APPARATUS

(75) Inventors: Kazuo Kido, Osaka (JP); Kenichi Kaida, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 899 days.

(21) Appl. No.: 13/203,841

(22) PCT Filed: Dec. 28, 2010

(86) PCT No.: PCT/JP2010/007585
§ 371 (c)(1),
(2), (4) Date: Aug. 30, 2011

(87) PCT Pub. No.: WO2011/089681
PCT Pub. Date: Jul. 28, 2011

(65) Prior Publication Data
US 2011/0308081 A1 Dec. 22, 2011

(30) Foreign Application Priority Data

Jan. 19, 2010 (JP) .................................. 2010-009436

(51) Int. Cl.
*H05K 3/30* (2006.01)
*B23P 19/00* (2006.01)
*H05K 13/00* (2006.01)

(52) U.S. Cl.
CPC ....... *H05K 13/0061* (2013.01); *Y10T 29/53174* (2015.01); *Y10T 29/4913* (2015.01)

(58) Field of Classification Search
CPC ................. H01L 2924/01079; H05K 13/0413; H01R 43/205

USPC ..................................... 29/832, 833, 834, 739
See application file for complete search history.

(56) References Cited

U.S. PATENT DOCUMENTS 4,825,808 A * 5/1989 Takahashi et al. ............ 118/719
5,730,574 A * 3/1998 Adachi et al. ............ 414/225.01
(Continued)

FOREIGN PATENT DOCUMENTS

JP 08-037398 2/1996
JP 2001-163428 6/2001
(Continued)

OTHER PUBLICATIONS

International Search Report issued Feb. 1, 2011 in International (PCT) Application No. PCT/JP2010/007585.

*Primary Examiner* — David Angwin
(74) *Attorney, Agent, or Firm* — Wenderoth, Lind & Ponack, L.L.P.

(57) ABSTRACT

A component mounting method of mounting a component onto a board by a component mounting apparatus which includes a transportation device having a plurality of rails capable of transporting a plurality of boards in parallel is provided. The method includes positioning the rails so that a center of a mounting area in a forward-backward direction is at an intermediate position between corresponding parts of two component supply units, the mounting area covering an area in which two mounting heads mount components on one or more of the boards which are transported by the transportation device, and the intermediate position being equally distant in the forward-backward direction from the two component supply units; and alternately mounting the components in the mounting area between the two mounting heads.

7 Claims, 16 Drawing Sheets

(56) References Cited

U.S. PATENT DOCUMENTS

| | | | |
|---|---|---|---|
| 5,988,353 A * | 11/1999 | Asai et al. | 198/468.4 |
| 6,321,898 B1 * | 11/2001 | Inoue et al. | 198/465.1 |
| 6,415,904 B1 * | 7/2002 | Markiewicz | 198/463.3 |
| 7,367,115 B2 * | 5/2008 | Nakai et al. | 29/740 |
| 7,559,134 B2 * | 7/2009 | Gaida | 29/720 |
| 8,162,128 B2 * | 4/2012 | Kimura et al. | 198/468.3 |
| 8,707,548 B2 * | 4/2014 | Abe | 29/720 |
| 2001/0004042 A1 * | 6/2001 | Ikeda et al. | 198/456 |
| 2009/0049680 A1 * | 2/2009 | Morita | 29/740 |
| 2009/0250313 A1 * | 10/2009 | Kimura et al. | 198/465.1 |
| 2010/0064511 A1 * | 3/2010 | Maenishi | 29/832 |
| 2010/0223782 A1 * | 9/2010 | Maenishi | 29/739 |
| 2010/0325860 A1 * | 12/2010 | Maenishi | 29/407.01 |
| 2011/0308081 A1 * | 12/2011 | Kido et al. | 29/832 |

FOREIGN PATENT DOCUMENTS

| | | | |
|---|---|---|---|
| JP | 2003-204192 | | 7/2003 |
| JP | 2004-031613 | | 1/2004 |
| JP | 2006-080158 | | 3/2006 |
| JP | 2006080158 | * | 3/2006 |
| JP | 2008-060543 | | 3/2008 |
| JP | 2009-224764 | | 10/2009 |
| JP | 2009-253070 | | 10/2009 |
| WO | 2008/015988 | | 2/2008 |
| WO | 2009/104410 | | 8/2009 |

* cited by examiner

FIG. 2
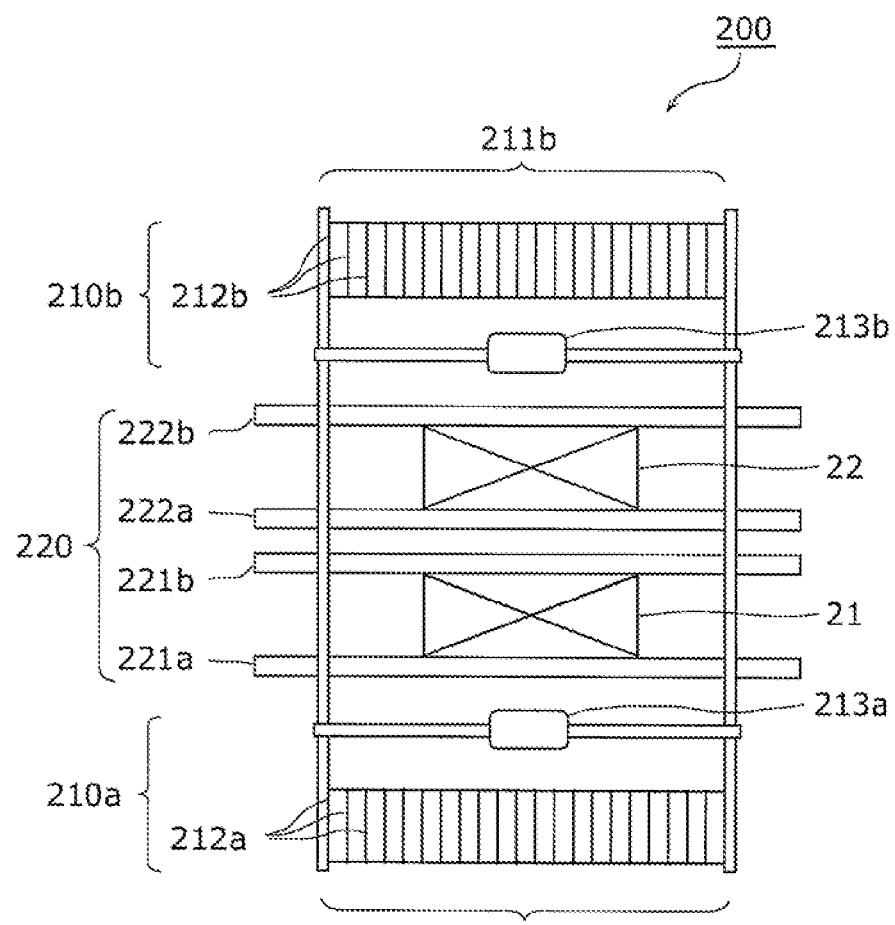
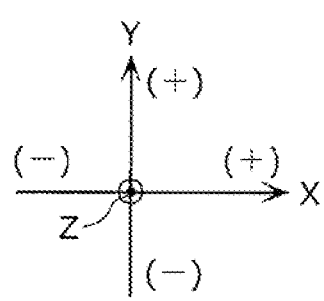

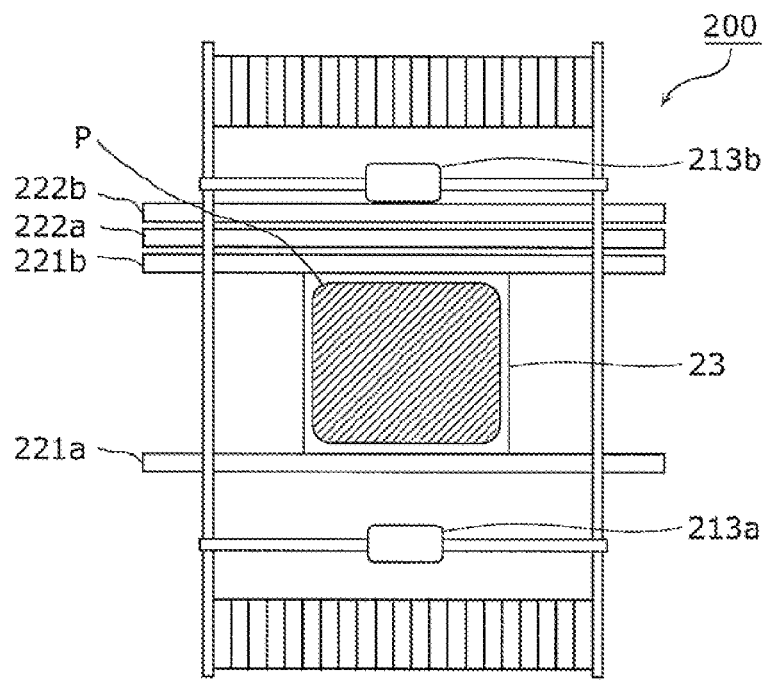
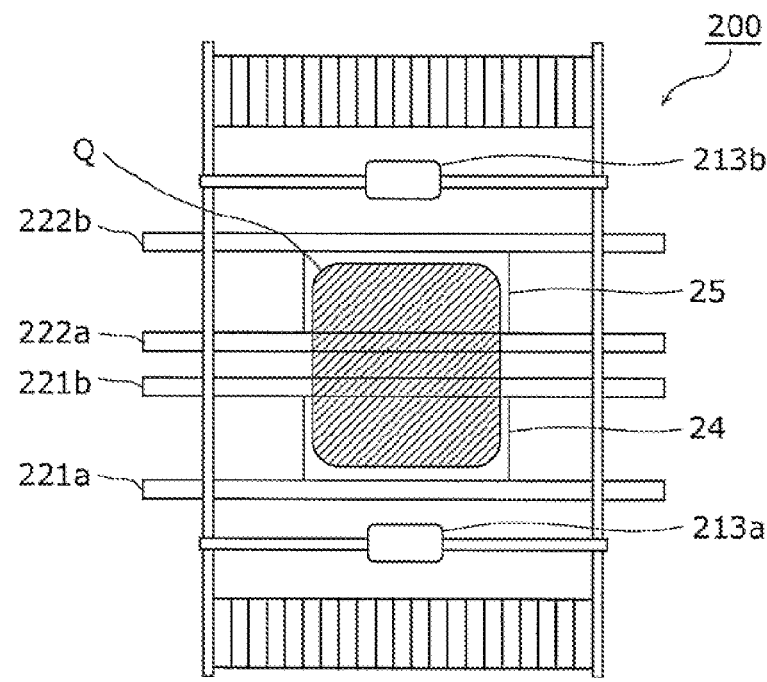

Mounting point pi = (Component type ci, X-coordinate xi, Y-coordinate yi, Control data $\phi$i, Mounting angle $\theta$i)

| Board type | Transportation rail | Inner rail |
|---|---|---|
| S1 | R1, R2 | — |
| S2 | R1, R4 | R2, R3 |
| ⋮ | ⋮ | ⋮ |
| S3 | R1, R2 | — |
| S3 | R3, R4 | — |
| ⋮ | ⋮ | ⋮ |

COMPONENT MOUNTING METHOD AND COMPONENT MOUNTING APPARATUS

TECHNICAL FIELD

The present invention relates to a component mounting method and a component mounting apparatus which include a transportation device having a plurality of rails in parallel on which a plurality of boards can be transported in parallel, and alternately mount components onto the boards which are transported by the transportation device.

BACKGROUND ART

In a component mounting apparatus which mounts a component onto a board, a transportation lane having two rails in parallel is provided so that the board is supported on the lane and thus transported. There is also known a component mounting apparatus which includes a plurality of transportation lanes in parallel on which a plurality of boards can be transported in parallel.

In such a component mounting apparatus, the transportation lane needs to have a width according to the size of a board to be transported. Component mounting apparatuses have therefore been proposed which are capable of displacing the rails of the transportation lane to transport boards of various sizes (see Patent Literatures 1 and 2, for example). In these component mounting apparatuses, the rails of the transportation lane are displaced according to the size of the board to be transported, to change the rail-to-rail width so that even a large board can be transported.

CITATION LIST

Patent Literature

[PTL 1] Japanese Patent No. 4162930
[PTL 2] Japanese Unexamined Patent Application Publication No. 2001-163428

Here, such conventional component mounting apparatuses include a known component mounting apparatus of what is called "alternate punching" that includes two mounting heads for alternately mounting components onto a transported board.

The conventional component mounting apparatus including a plurality of rails on which a plurality of boards can be transported in parallel has a problem of a mounting time loss occurring in alternately mounting components onto the board.

FIGS. 16A and 16B explain the mounting time loss occurring when the conventional component mounting apparatus alternately mounts components onto a board.

As shown in FIG. 16A, a component mounting apparatus 1000 includes a transportation lane 315 having two rails 315a and 315b, and a transportation lane 316 having two rails 316a and 316b. The transportation lane 315 transports a board 31 while the transportation lane 316 transports a board 32.

Furthermore, the component mounting apparatus 1000 includes two component supply units 311a and 311b and two mounting heads 313a and 313b. The two mounting heads 313a and 313b alternately pick up components from the two component supply units 311a and 311b, respectively, and mount the components onto the board 31 and the board 32.

When one board having a size larger than the sizes of the board 31 and the board 32 is to be transported, the component mounting apparatus 1000 displaces, as shown in FIG. 16B, the rail 315b and the rail 316a toward the rail 316b (in the Y-axis direction in the figure). The two mounting heads 313a and 313b then alternately pick up components from the two component supply units 311a and 311b, respectively, and mount the components onto a board 33.

However, in this component mounting apparatus 1000, a mounting time loss occurs when the two mounting heads 313a and 313b alternately mount the components onto board 33. Specifically, the distance in which the mounting head 313a moves to mount a component onto the board 33 after picking up the component from the component supply unit 311a is different from the distance in which the mounting head 313b moves to mount a component onto the board 33 after picking up the component from the component supply unit 311b. The mounting head 313a, which moves the shorter distance, therefore needs to wait until the mounting head 313b, which moves the longer distance, finish mounting the component onto the board 33. This waiting time is the mounting time loss.

Thus, the conventional component mounting apparatus including a plurality of rails on which a plurality of boards can be transported in parallel has a problem of the mounting time loss occurring in alternately mounting components onto a board.

SUMMARY OF INVENTION

Solution to Problem

In view of the above problem, the present invention has been devised, and an object thereof is to provide a component mounting method and a component mounting apparatus which include a plurality of rails on which a plurality of boards can be transported in parallel, and are capable of reducing a mounting time loss occurring in alternately mounting components onto the board.

Means to Solve Problem

In order to achieve the above object, a component mounting method according to an aspect of the present invention is a component mounting method executed by a component mounting apparatus in mounting a component onto a board, the component mounting apparatus including: a transportation device having, in a forward-backward direction orthogonal to a transportation direction of the board, a plurality of rails provided in parallel and capable of transporting, in parallel, a plurality of boards onto which components are mounted; two mounting heads capable of alternately mounting the components onto the boards which are transported by the transportation device; and two component supply units disposed across the transportation device in the forward-backward direction and supplying the two mounting heads with the components, the component mounting method including: positioning the rails so that a center of a mounting area in the forward-backward direction is at an intermediate position between the two component supply units, the mounting area covering an area in which the two mounting heads mount the components on one or more of the boards which are transported by the transportation device, and the intermediate position being equally distant in the forward-backward direction from the two component supply units; and alternately mounting the components in the mounting area by the two mounting heads.

By so doing, the rails are positioned so that the center of the mounting area in a forward-backward direction thereof is at the intermediate position between the two component supply units, and the components are alternately mounted in the mounting area. This equalizes the distances from the two component supply units to the mounting area. In other words, this equalizes the distances over which the two mounting heads move to mount the components onto the board after picking up the components from the component supply units, with the result that the waiting time of the mounting heads in alternately mounting the components onto the board is reduced. Thus, the mounting time loss in alternately mounting the components onto the board can be reduced despite the presence of a plurality of rails on which a plurality of boards can be transported in parallel.

Furthermore, preferably, in the positioning, when two or more of the boards are transported in parallel, the two or more boards are positioned close to each other in the forward-backward direction so as to reduce a size of the mounting area including at least an area on the two or more boards in which the components are mounted, and the rails are positioned so that the center of the mounting area in the forward-backward direction is at the intermediate position between the two component supply units.

With this, in the case where two or more boards are transported in parallel, the two or more boards are positioned close to each other in the forward-backward direction so as to reduce the size of the mounting area, and the rails are positioned so that the center of the mounting area in the forward-backward direction is at the intermediate position between the two component supply units. This means that converging the mounting area at the intermediate position between the component supply units reduces an area which is included in the mounting area and where the two mounting heads move over different distances to mount the components onto the board after picking up the components from the component supply units. The waiting time of the mounting heads is therefore reduced in alternately mounting the components onto the board. Thus, the mounting time loss in alternately mounting the components onto the board can be reduced despite the presence of a plurality of rails on which a plurality of boards can be transported in parallel.

Furthermore, preferably, in the positioning, the rails are positioned by displacing, in the forward-backward direction, at least two of the rails on which the board is transported.

With this, at least two of the rails on which the board is transported are displaced in the forward-backward direction to position the rails. Thus, displacing the rails in the forward-backward direction allows the rails to be positioned, and the mounting time loss in alternately mounting the components onto the board can be reduced.

Furthermore, preferably, the component mounting method further includes raising and lowering an inner rail that is positioned between two of the rails on which the board is transported, and in the positioning, the rails are positioned so as to position the board across the inner rail between the two rails.

With this, the rails are positioned by lowering the inner rail so that the board is positioned across the inner rail between the two rails. Thus, lowering the inner rail allows the board to be positioned.

Furthermore, preferably, in the raising and lowering, the inner rail is lowered at a position at which the inner rail supports a lower surface of the board from below, in the positioning, the two rails on which the board is transported are positioned to position the board so that the inner rail can support the lower surface of the board from below, and in the alternately mounting, the components are alternately mounted in the mounting area with the inner rail, raised in the raising and lowering, supporting the lower surface of the board from below.

With this, the rails are positioned with the inner rail raised and lowered so that the board is held with its lower surface supported from below by the inner rail. Thus, the inner rail can be used as a support for supporting the board from below.

Furthermore, preferably, the transportation device further includes a board carry-in/out conveyor which carries one of the boards to be transported, onto two of the rails on which the one board is transported, and carries the one board out from the two rails, and the component mounting method further includes displacing the board carry-in/out conveyor in the forward-backward direction to cause the board carry-in/out conveyor to carry the one board onto the two rails or carry the one board out from the two rails, while mounting the components in the mounting area on an other board different from the one board in the alternately mounting.

With this, a board carry-in/out conveyor which carries the board in or out is further provided, and while the components are being mounted onto the board, the board carry-in/out conveyor is displaced in the forward-backward direction so that the board carry-in/out conveyor carries in or out another board which is transported in parallel. This means that since another board can be carried in or out while the components are being mounted onto the board, the time loss caused by carrying a board in or out can be reduced. Thus, not only the mounting time loss in alternately mounting the components onto the board can be reduced, but also the carry-in or -out time loss can be reduced.

Furthermore, preferably, the mounting area includes an area in which the two mounting heads alternately mount the components on one of the boards or two or more of the boards which are transported in parallel, and in the positioning, the rails on which the board is transported are positioned so that one of the following positions is at the intermediate position between the two component supply units: a center position of a length of the mounting area in the forward-backward direction; an average position of a plurality of mounting points in the forward-backward direction inside the mounting area; a position in the mounting area, which is located at the intermediate position in the forward-backward direction between the two component supply units when mounting time required to mount predetermined components in the mounting area is minimum; a center position of a length, in the forward-backward direction, of a board having a longest length in the forward-backward direction among the two or more boards which are transported in parallel; and an average position of the mounting points in the forward-backward direction on a board with a largest number of mounting points among the two or more boards.

With this, the rails can be appropriately positioned according to the size of the board to be transported, the number of mounting points, and the like. This means that appropriate positioning of rails allows a reduction in the mounting time loss in alternately mounting the components onto the board.

Furthermore, in order to achieve the above object, a component mounting apparatus according to an aspect of the present invention is a component mounting apparatus which mounts a component onto a board, and the component mounting apparatus includes: a transportation device having, in a forward-backward direction orthogonal to a transportation direction of the board, a plurality of rails provided in parallel and capable of transporting, in parallel, a plurality of boards onto which components are mounted; two mounting heads capable of alternately mounting the components onto the boards which are transported by the transportation device; two component supply units disposed across the transportation device in the forward-backward direction and supplying the two component mounting heads with the components;

and a control device which positions the rails so that a center of a mounting area in the forward-backward direction is at an intermediate position between the two component supply units, the mounting area covering an area in which the two mounting heads mount the components on one or more of the boards which are transported by the transportation device, and the intermediate position being equally distant in the forward-backward direction from the two component supply units, and the control device further causes the two mounting heads to alternately mount the components in the mounting area.

By so doing, the rails are positioned so that the center of the mounting area in a forward-backward direction thereof is at the intermediate position between the two component supply units, and the components are alternately mounted in the mounting area. This equalizes the distances from the two component supply units to the mounting area. In other words, this equalizes the distances over which the two mounting heads move to mount the components onto the board after picking up the components from the component supply units, with the result that the waiting time of the mounting heads in alternately mounting the components onto the board is reduced. Thus, the mounting time loss in alternately mounting the components onto the board can be reduced despite the presence of a plurality of rails on which a plurality of boards can be transported in parallel.

Furthermore, preferably, the component mounting apparatus further includes: a support pin disposed on top of an inner rail positioned between two of the rails on which the board is transported, the support ping supporting a lower surface of the board from below; and a displacement mechanism which raises and lowers the inner rail at a position at which the support pin supports the lower surface of the board from below, and the control device (i) positions the two rails on which the board is transported, so as to position the board across the inner rail between the two rails, and (ii) causes the two mounting heads to alternately mount the components in the mounting area with the support pin disposed on the inner rail, raised by the displacement mechanism, supporting the lower surface of the board from below.

With this, the rails are positioned with the inner rail raised and lowered by a displacement mechanism so that the support pin supports the board. In other words, it is possible that the board is supported from below by the support pin while the components are being mounted in the mounting area. Thus, the inner rail can be used as a support for supporting the board from below.

Furthermore, preferably, the transportation device further includes a board carry-in/out conveyor which carries one of the boards to be transported, onto two of the rails on which the board is transported, and carries the board out from the two rails, and the control device further displaces the board carry-in/out conveyor in the forward-backward direction to cause the board carry-in/out conveyor to carry the one board onto the two rails or carry the one board out from the two rails, while the two mounting heads are mounting the components in the mounting area on an other board different from the one board.

With this, a board carry-in/out conveyor which carries the board in or out is further provided, and while the components are being mounted onto the board, the board carry-in/out conveyor is displaced in the forward-backward direction so that the board carry-in/out conveyor carries in or out another board which is transported in parallel. This means that since another board can be carried in or out while the components are being mounted onto the board, the time loss caused by carrying a board in or out can be reduced. Thus, not only the mounting time loss in alternately mounting the components onto the board can be reduced, but also the carry-in or -out time loss can be reduced.

It is to be noted that the present invention can be implemented not only as the component mounting method and the component mounting apparatus, but also as a transportation device included in the component mounting apparatus. Furthermore, the present invention can be implemented as a component mounting apparatus including a processing unit which performs a process included in the component mounting method, and can also be implemented as a program and an integrated circuit which cause a computer to execute such a characteristic process. In addition, it goes without saying that such a program may be distributed via a recording medium such as a CD-ROM and a communication network such as the Internet.

Advantageous Effects of Invention

The present invention can reduce a mounting time loss in alternately mounting components onto a board in a component mounting apparatus including a plurality of rails on which a plurality of boards can be transported in parallel.

BRIEF DESCRIPTION OF DRAWINGS

FIG. 2 is a plan view showing a primary internal structure of a component mounting apparatus according to the first embodiment.

FIG. 6A explains a mounting area according to the first embodiment.

FIG. 6B explains a mounting area according to the first embodiment.

DESCRIPTION OF EMBODIMENTS

The following describes a component mounting system including a component mounting apparatus according to embodiments of the present invention with reference to the drawings.

First Embodiment

Figure 1:
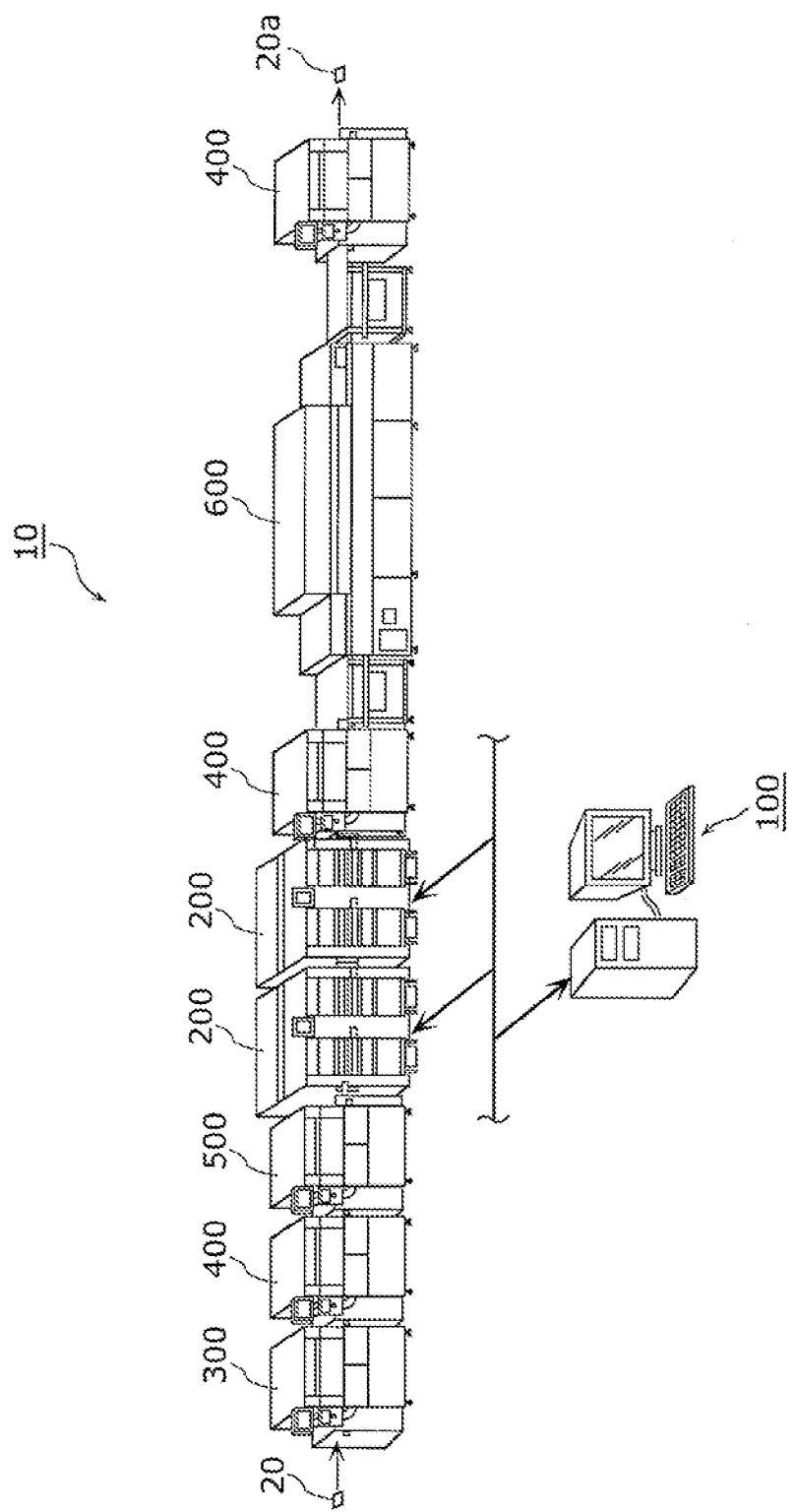
FIG. 1 is an exterior view showing a structure of a component mounting system according the first embodiment.

FIG. 1 is an exterior view showing a structure of a component mounting system 10 according the first embodiment.

The component mounting system 10 is a system for transporting a board from an upstream production machine toward a downstream production machine to produce a component-mounted board with a component such as an electronic component mounted thereon. As shown in FIG. 1, the component mounting system 10 includes a control device 100, two component mounting apparatuses 200, a printing device 300, three inspection devices 400, an adhesive applicator 500, and a reflow furnace 600. That is, the component mounting system 10 transports a board 20 from the printing device 300 located upstream to the inspection device 400 located downstream to produce a component-mounted board 20a.

The control device 100 is a device which executes a component mounting method according to an aspect of the present invention. This means that the control device 100 controls each of the component mounting apparatuses 200 so that the component mounting apparatus 200 can reduce the mounting time loss in alternately mounting the components onto the board.

The component mounting apparatus 200 is an apparatus which mounts the component onto the board. Specifically, the plurality of component mounting apparatuses 200 mount the components while transporting the board from an upstream side to a downstream side. In other words, first, the component mounting apparatus 200 located upstream receives the board and mounts the component onto that board. Then, the board with the component mounted thereon is sent out to the component mounting apparatus 200 located downstream. As such, the boards are sequentially transported to each of the component mounting apparatuses 200 by which the components are mounted onto the boards.

The printing device 300 is a screen printing device which receives the board 20 from a stocker (not shown) in which the boards are stocked, and applies the screen-printing technique to a surface of the board 20 using solder paste that is solder in paste form.

The adhesive applicator 500 is a device which applies adhesive onto the board.

The reflow furnace 600 is a device which heats the board 20 with the component mounted thereon to melt solder or the like so that the component will be then fixed onto the board.

The inspection device 400 is a device which inspects a condition on the board. Specifically, the three inspection devices 400 are provided; the inspection device 400 which inspects a condition of appearance of the board soldered by the printing device 300, the inspection device 400 which inspects a condition of the board with a component mounted thereon by the component mounting apparatus 200, and the inspection device 400 which inspects a condition of the board thermally treated by the reflow furnace 600.

Furthermore, the component-mounted board 20a which has the component mounted thereon and then has been inspected by the inspection devices 400 is sent to the stocker (not shown) in which the boards are stocked.

Next, the structure of the component mounting apparatus 200 is described.

FIG. 2 is a plan view showing a primary internal structure of the component mounting apparatus 200 according to the first embodiment. Here, the X-axis direction represents a direction in which the board is transported, and the Y-axis direction represents the forward-backward direction of the component mounting apparatus, which is orthogonal to the X-axis direction on the horizontal plane.

The component mounting apparatus 200 includes two mounting units 210a and 210b which mount the components onto two boards 21 and 22, and a transportation device 200 which transports the two boards.

The two mounting units 210a and 210b mounts the components onto the board 21 and the board 22 in coordination with each other.

Furthermore, the mounting unit 210a and the mounting unit 210b have like structures. Specifically, the mounting unit 210a includes a component supply unit 211a, a mounting head 213a, and a component recognition camera (not shown). Likewise, the mounting unit 210a includes a component supply unit 211b, a mounting head 213b, and a component recognition camera (not shown).

Now, the detailed structure of the mounting unit 210a is described. The detailed structure of the mounting unit 210b is the same or alike as that of the mounting unit 210a and therefore not described.

The component supply unit 211a includes an array of a plurality of component feeders 212a each storing a component tape. Here, the component tape refers to, for example, a tape (carrier tape) on which components of the same component type are arranged, and is supplied with being taken up by a reel or the like. Furthermore, the components arranged on the component tape are chips or the like, and more specifically, 0402 chip components measuring 0.4 mm×0.2 mm, and 1005 chip components measuring 1.0 mm×0.5 mm, for example.

The mounting head 213a includes, for example, up to 10 pickup nozzles, and can thereby pick up, up to 10 components from the component supply unit 211a and mount them onto the boards 21 and 22.

Figure 3:
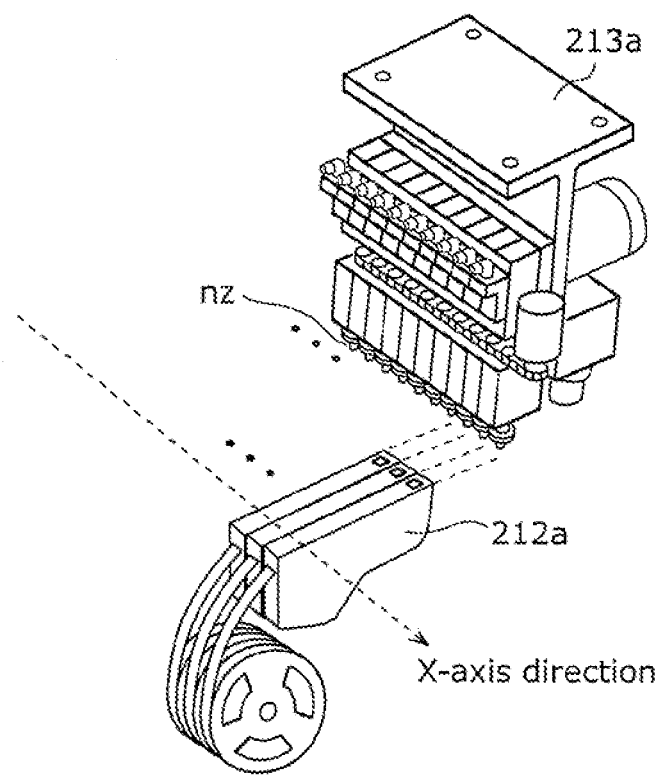
FIG. 3 is a schematic view showing a mounting head and a component feeder in the component mounting apparatus according to the first embodiment.

FIG. 3 is a schematic view showing the mounting head 213a and the component feeder 212a in the component mounting apparatus 200 according to the first embodiment.

As described above, the mounting head 213a may be equipped with, for example, up to 10 pickup nozzles nz. The mounting head 213a equipped with the 10 pickup nozzles nz can pick up (with a single up-and-down movement) up to 10 components simultaneously from the component feeders 212a.

In the mounting unit 210a of the component mounting apparatus 200, the mounting head 213a moves to the component supply unit 211a and picks up the component supplied from the component supply unit 211a. Then, the mounting head 213a in the mounting unit 210a moves to the board 21 and sequentially mounts all the picked-up components at the mounting points on the board 21, for example. The mounting head 213a in the mounting unit 210a repeatedly performs operations of picking up, moving, and mounting, to mount all predetermined components onto the board 21. Likewise, the mounting unit 210a mounts all the predetermined components onto the board 22.

Furthermore, the mounting head 213b in the mounting unit 210b repeatedly performs operations of picking up, moving, and mounting, to mount all predetermined components onto the boards 21 and 22, as in the mounting unit 210a.

The mounting units 210a and 210b alternately mount the components onto the boards 21 and 22; that is, while one of the mounting units 210a and 210b mounts the component, the other of the mounting units 210a and 210b picks up the component from the corresponding component supply unit, and conversely, while the one of the mounting units 210a and 210b picks up the component from the corresponding component supply unit, the other of the mounting units 210a and 210b mounts the component. In other words, the component mounting apparatus 200 is configured as a component mounting apparatus of what is called "alternate punching".

With reference back to FIG. 2, the transportation device 220 is a transportation device which is capable of transporting a plurality of boards in parallel. The transportation device 220 has a plurality of rails in parallel in the forward-backward direction orthogonal to the transportation direction of the boards, on which rails the plurality of boards onto which the components are to be mounted can be transported in parallel.

Specifically, the transportation device 220 includes a rail 221a for supporting the front end of the board 21, a rail 221b for supporting the rear end of the board 21, a rail 222a for supporting the front end of the board 22, and a rail 222b for supporting the rear end of the board 22.

Each of the rails 221a, 221b, 222a, and 222b is positioned along the X-axis direction that is the transportation direction of the board. This means that the transportation device 220 transports the board 21 using the rails 221a and 221b and transports the board 22 using the rails 222a and 222b.

The four rails 221a, 221b, 222a, and 222b are metallic rails which support the lower surfaces of the boards to be transported and each of which includes, along the rail, a transportation belt or chain (not shown) for transporting the board, and the rails are not particularly limited in material or size and may be of any material including resin and of any shape as long as it can stably transport the board.

Next, the structure of the transportation device 220 is described in detail.

Figure 4:
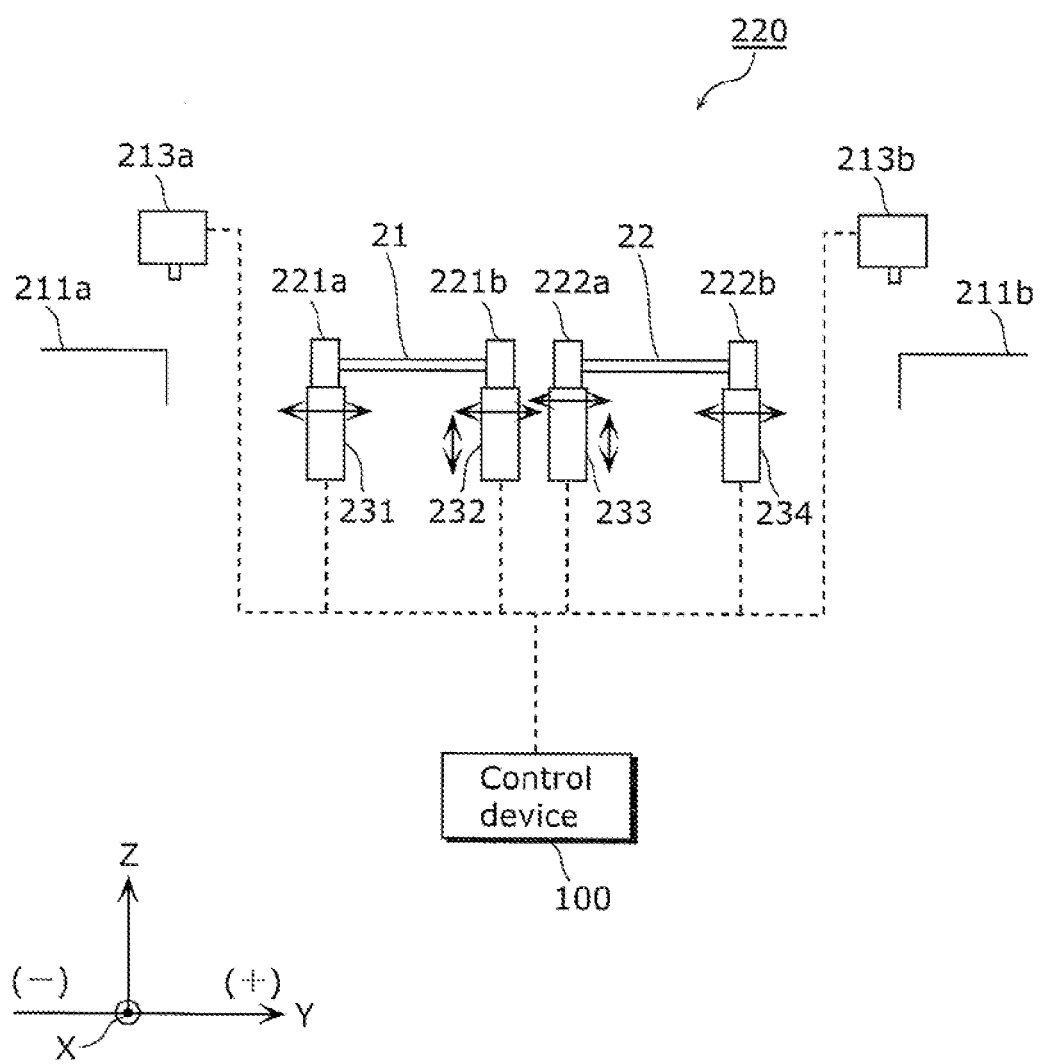
FIG. 4 explains, in detail, a structure of a transportation device according to the first embodiment.

FIG. 4 explains, in detail, the structure of the transportation device 220 according to the first embodiment. FIG. 4 shows the transportation device 220 of FIG. 2 as seen from right (that is, from the plus side in the X-axis direction shown in FIG. 2). The Y-axis direction shown in FIG. 4 is the same direction as the Y-axis direction shown in FIG. 2, and the vertical direction is referred to as the Z-axis direction.

As shown in FIG. 4, the transportation device 220 includes, in addition to the four rails 221a, 221b, 222a, and 222b, four displacement mechanisms 231 to 234 corresponding to the respective four rails 221a, 221b, 222a and 222b.

The displacement mechanisms 231 and 234 displace the respective rails 221a and 222b in the forward-backward direction of the component mounting apparatus 200 (in the Y-axis direction shown in FIG. 4) according to an instruction from the control device 100. The displacement mechanisms 232 and 233 displace the respective rails 221b and 222a in the vertical direction (in the Z-axis direction shown in FIG. 4) and in the forward-backward direction of the component mounting apparatus 200 (in the Y-axis direction shown in FIG. 4) according to an instruction from the control device 100.

That is, the displacement mechanisms 231 to 234 displace, in the forward-backward direction, the rails on which the boards are transported, according to the lengths of the boards in the forward-backward direction. Furthermore, the displacement mechanisms 232 and 233 raise and lower the respective rails 221b and 222a located between the rails 221a and 222b, in the case where the board is transported on the rails 221a and 222b.

Subsequently, according to an instruction from the control device 100, the mounting heads 213a and 213b pick up the components from the respective component supply units 211a and 211b, and mount that components onto the board.

The displacement mechanisms 231 to 234 may be any mechanisms as long as they can displace the rails 221a to 222b in the forward-backward direction or in the vertical direction, and include, for example, gears, worm gears, cam mechanisms, ball screws, trapezoidal threads, and air cylinders, to displace the rails.

Next, the structure of the control device 100 is described in detail.

Figure 5:
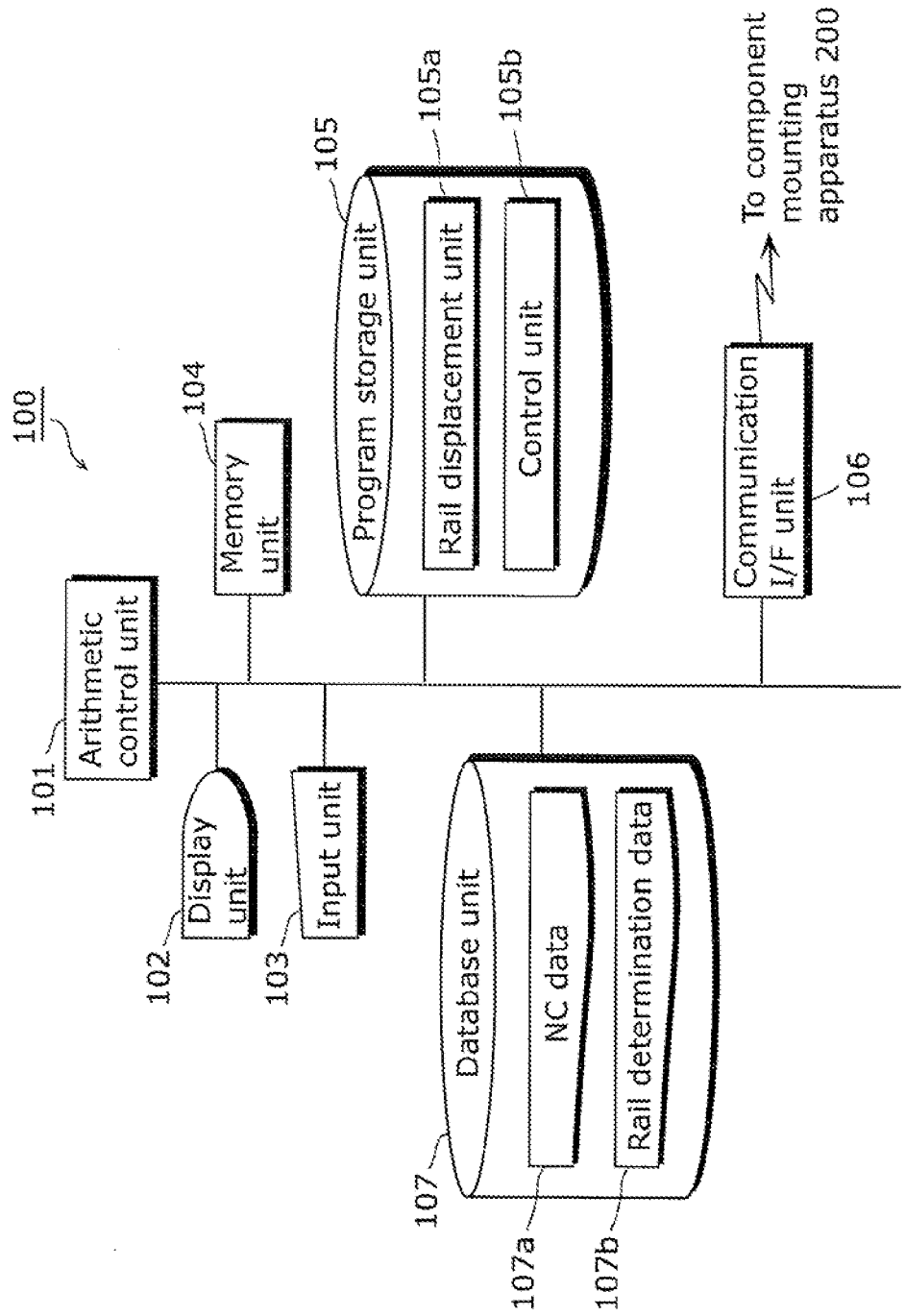
FIG. 5 is a block diagram showing a functional structure of a control device according to the first embodiment.

FIG. 5 is a block diagram showing a functional structure of the control device 100 according to the first embodiment.

The control device 100 is a computer which controls the component mounting apparatus 200. This control device 100 is implemented by the execution of a program in a general-purpose computer system such as a personal computer.

As shown in FIG. 5, the control device 100 includes an arithmetic control unit 101, a display unit 102, an input unit 103, a memory unit 104, a program storage unit 105, a communication I/F (interface) unit 106, and a database unit 107.

The arithmetic control unit 101 is a Central Processing Unit (CPU), a numerical processor or the like. In response to an instruction or the like from an operator, the arithmetic control unit 101 loads a necessary program from the program storage unit 105 into the memory unit 104, and executes the program. Then, in accordance with the execution result, the arithmetic control unit 101 controls each of the constituent elements 102 to 107.

The display unit 102 is a Cathode-Ray Tube (CRT), a Liquid Crystal Display (LCD) or the like, and the input unit 103 is a keyboard, a mouse and the like. These units are used to give an instruction to the component mounting apparatus 200 under control of the arithmetic control unit 101.

The communication I/F unit 106 is a Local Area Network (LAN) adapter or the like, and is used for communication and the like between the control device 100 and the component mounting apparatus 200. The memory unit 104 is a Random Access Memory (RAM) or the like that provides a working area for the arithmetic control unit 101.

The program storage unit 105 is a hard disk and the like for storing various programs for implementing the functions of the control device 100. Each of the programs is a program for giving an instruction to the component mounting apparatus 200, and the program storage unit 105 functionally (as a processing unit that performs the functions when executed by the arithmetic control unit 101) includes a rail displacement unit 105a and a control unit 105b.

The rail displacement unit 105a positions rails so that the center, in the forward-backward direction, of the mounting area that covers an area in which the two mounting heads 213a and 213b mount the components on one or more boards which are transported by the transportation device 220, is at the intermediate position between the two component supply units 211a and 211b which position is equally distant in the forward-backward direction from the two component supply units 211a and 211b. Here, it is sufficient that the intermediate position is a substantial middle position, and the range of definition thereof is tolerated in the range of plus and minus 10 percent in the forward-backward direction, for example.

Furthermore, in the case where two or more boards are transported in parallel, the rail displacement unit 105a positions the two or more boards close to each other in the forward-backward direction so as to reduce the size of the mounting area including at least an area on the two or more boards in which the components are mounted, and positions the rails so that the center of the mounting area in the forward-backward direction is at the intermediate position between the two component supply units 211a and 211b.

Specifically, the rail displacement unit 105a positions the rails by displacing, in the forward-backward direction, at least two of the rails on which the boards are transported. More specifically, the rail displacement unit 105a causes the displacement mechanisms 231 to 234 to displace the respective rails 221a to 222b.

Now, the mounting area is described in detail below.

FIGS. 6A and 6B each explain a mounting area according to the first embodiment.

The mounting area indicates an area including an area in which the two mounting heads 213a and 213b alternately mount the components on one of the boards or two or more of the boards which are transported in parallel.

Specifically, as shown in FIG. 6A, in the case where one board 23 is transported on a pair of the rails 221a and 221b, the mounting area is an area P located on the one board 23 and in which the two mounting heads 213a and 213b mount the components. That is, the area P is the minimum area which includes all the mounting points on the board 23.

It is to be noted that the mounting area may be an area which includes part of the mounting points on the board 23 and may instead be the entire area on the board 23 regardless of positions of the mounting points.

Furthermore, in the case where two or more boards are transported in parallel on two or more pairs of the rails, the mounting area is an area including the areas on the two or more boards.

Specifically, as shown in FIG. 6B, in the case where two boards 24 and 25 are transported in parallel on two pairs of the rails 221a and 221b and the rails 222a and 222b, the mounting area is an area Q including the areas on the two boards 24 and 25 in which the components are to be mounted. That is, the area Q is the minimum area which includes all the mounting points on the boards 24 and 25.

It is to be noted that the mounting area may be an area which includes part of the mounting points on the boards 24 and 25 and may instead be the entire areas on the boards 24 and 25 regardless of positions of the mounting points.

Furthermore, the center of the mounting area in the forward-backward direction herein indicates the center position of the length of the mounting area in the forward-backward direction. It is to be noted that the center position indicates a substantial center position and is thus tolerated in the range of plus and minus 10 percent in the forward-backward direction, for example.

Furthermore, the center of the mounting area in the forward-backward direction may be at a position determined by averaging the coordinates, in the forward-backward direction, of part or all of the mounting points in the mounting area, or may be at a position in the mounting area, which is located at the intermediate position in the forward-backward direction between the two component supply units 211a and 211b when mounting time required to mount predetermined components in the mounting area is minimum. In this case, the position only needs to be such a position that, for example, the lengths of mounting time for the two mounting heads to alternately mount components onto the board are not very different, and is thus tolerated in the range of plus and minus 10 percent in the forward-backward direction, for example.

With reference back to FIG. 5, the control unit 105b causes the two mounting heads 213a and 213b to alternately mount the components in the mounting area.

The database unit 107 is a hard disk or the like that stores, for example, NC data 107a, rail determination data 107b, and the like that are used, for example, for the instruction given by this control unit 100 to the component mounting apparatus 200.

Figures 7A, 7B:
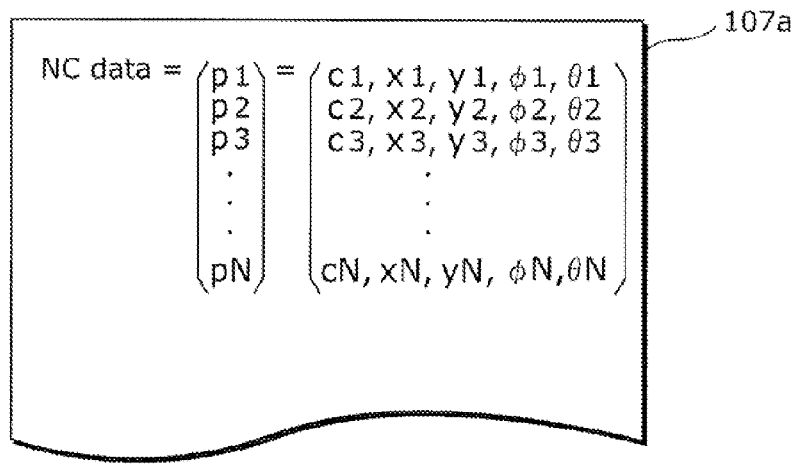
FIG. 7A shows an example of NC data according to the first embodiment.
FIG. 7B shows an example of rail determination data according to the first embodiment.

FIGS. 7A and 7B show respective examples of the NC data 107a and the rail determination data 107b.

FIG. 7A shows an example of the NC data 107a according to the first embodiment.

The NC data 107a is a collection of information indicating mounting points for all components to be mounted. One mounting point pi includes a component type $c_i$, an X-coordinate $x_i$, a Y-coordinate $y_i$, control data $\phi_i$, and a mounting angle $\theta_i$. Here, the component type corresponds to a name of a component to be mounted, the X-coordinate and Y-coordinate are coordinates of the mounting point (coordinates that indicates a particular position on the board), and the control data represents constraint information concerning the mounting of the component (such as a type of a usable pickup nozzle nz and the maximum moving speed of the mounting head). The mounting angle $\theta_i$ is an angle at which a nozzle that picks up a component of the component type $c_i$ is to be rotated. It is to be noted that the Numeric Control (NC) data to be eventually obtained is a sequence of mounting points that minimizes a line tact.

FIG. 7B shows an example of the rail determination data 107b according to the first embodiment.

The rail determination data 107b is a collection of information concerning the transportation rail and the inner rail in association with a board type. The rail determination data 107b includes "board type", "transportation rail", "inner rail" and the like.

Specifically, "board type" indicates a type of the board to be transported, and "transportation rail" indicates two rails which are used to transport the board of "board type". In addition, "inner rail" indicates a rail positioned between the two rails indicated by "transportation rail".

For example, in order to transport a board of board type S2, rails R1 and R4 are used, and in this case, the inner rail is rails R2 and R3. In order to transport two boards of board type S3, the rails R1 and R2 and the rails R3 and R4 are used, and in this case, the inner rail is "absent".

With reference to the rail determination data 107b, the rail displacement unit 105a determines a rail to be displaced and causes the displacement mechanisms 231 to 234 to displace the rails 221a to 222b.

It is to be noted that the transportation rail and the inner rail in association with the board type in the rail determination data 107b may be predetermined, and may be updated by data input from an operator, or may be updated by calculations, by the rail displacement unit 105a, of the transportation rail and the inner rail according to the board type.

Next, a process which the control unit 100 performs is described.

Figure 8:
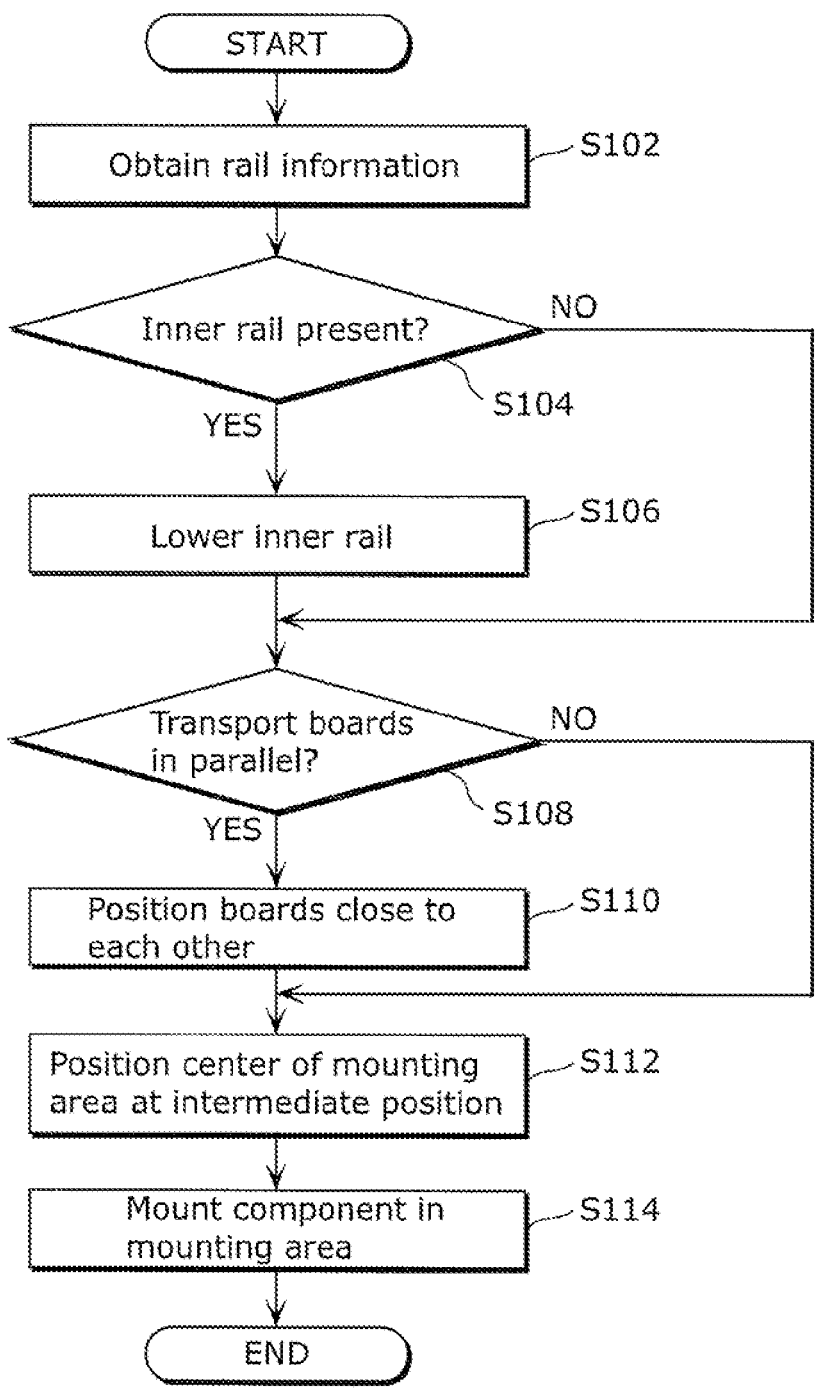
FIG. 8 is a flowchart showing an example of operation of the control device according to the first embodiment.

FIG. 8 is a flowchart showing an example of operation of the control device 100 according to the first embodiment.

As shown in FIG. 8, first, the rail displacement unit 105a obtains rail information with reference to the rail determination data 107b (S102). Here, the rail information indicates the transportation rail, and if present, the inner rail.

The rail displacement unit 105a then determines whether the inner rail is present or absent (S104).

When it is determined that the inner rail is absent (NO in S104), the rail displacement unit 105a determines whether or not the transportation device 220 transports a plurality of boards in parallel (S108).

When it is determined that the transportation device 220 does not transport a plurality of boards in parallel (NO in S108), the rail displacement unit 105a positions the rails so that the center of the mounting area in the forward-backward direction is at the intermediate position between the two component supply units 211a and 211b (S112).

When it is determined that the transportation device 220 transports a plurality of boards in parallel (YES in S108), the rail displacement unit 105a positions the boards close to each other so as to reduce the size of the mounting area (S110) and positions the rails so that the center of the mounting area in the forward-backward direction is at the intermediate position between the two component supply units 211a and 211b (S112).

The control unit 105b then controls operations of the two mounting heads 213a and 213b so that the two mounting heads 213a and 213b alternately mount the components in the mounting area (S114).

When it is determined the inner rail is present (YES in S104), the rail displacement unit 105a lowers the inner rail (S106). Specifically, the rail displacement unit 105a lowers the inner rail at the position at which the inner rail supports the lower surface of the board from below.

The rail displacement unit 105a then performs the processes (S108 to S112) of positioning the two rails on which the board is transported, so as to position the board across the inner rail between the two rails on which the board is transported and so that the inner rail can support the lower surface of the board from below.

The control unit 105b then controls operations of the two mounting heads 213a and 213b so that the inner rail raised by the rail displacement unit 105a supports the lower surface of the board from below while the two mounting heads 213a and 213b are alternately mounting the components in the mounting area (S114).

This ends the process which the control unit 100 performs.

Next, the process which the control unit 100 performs is described in further detail.

FIGS. 9A to 11B each explain a process which the control device 100 according to the first embodiment performs.

Figure 9A:
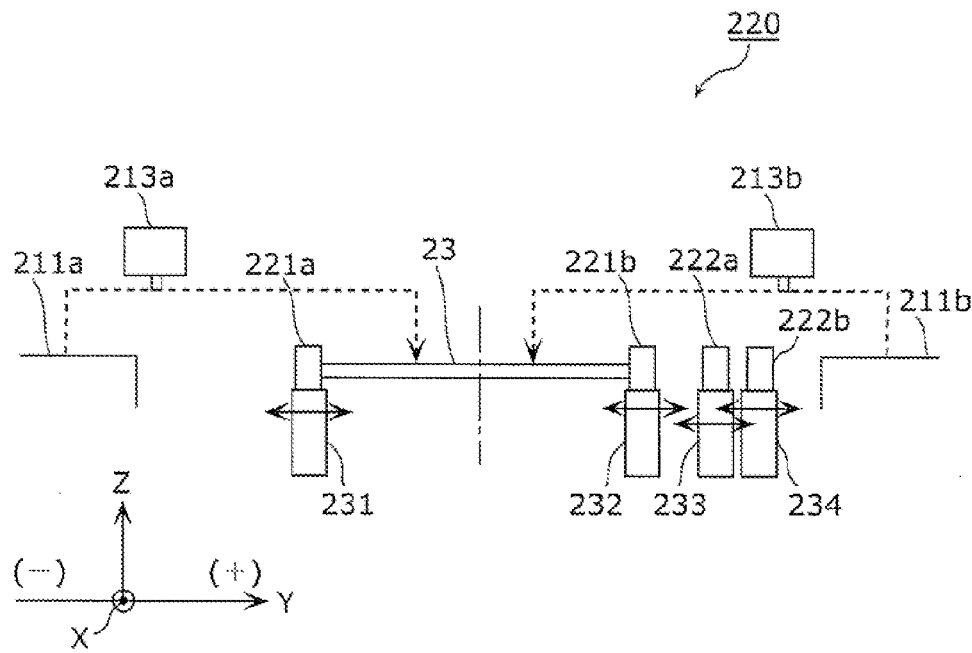
FIG. 9A explains a process which the control device according to the first embodiment performs.
Figure 9B:
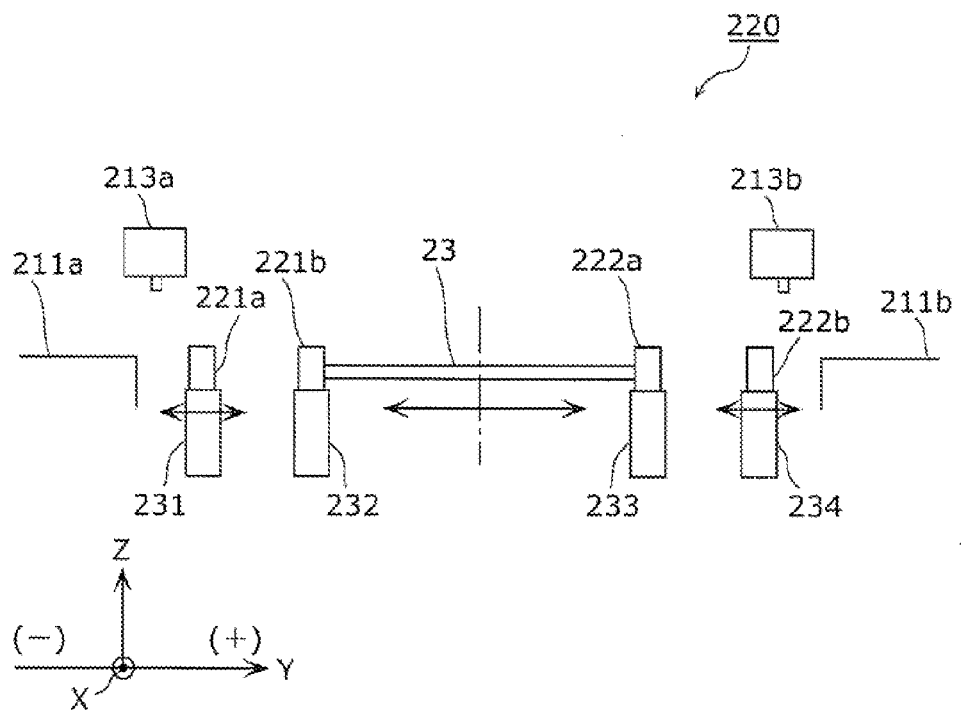
FIG. 9B explains a process which the control device according to the first embodiment performs.

Specifically, FIGS. 9A and 9B each explain the process which the control device 100 performs when the inner rail is absent (NO in Step S104 of FIG. 8) and a plurality of boards are not transported in parallel (NO in S108 of FIG. 8).

First, the rail displacement unit 105a obtains the rail information with reference to the rail determination data 107b (S102 of FIG. 8). Specifically, as shown in FIG. 9A, the rail displacement unit 105a obtains, as the transportation rail, the rails 221a and 221b on which the board 23 is transported. The rail displacement unit 105a obtains the rail information with the inner rail "absent".

The rail displacement unit 105a then determines whether the inner rail is present or absent (S104 of FIG. 8) and determines that the inner rail is absent (NO in S104 of FIG. 8). Thus, the rail displacement unit 105a determines whether or not the transportation device 220 transports a plurality of boards in parallel (S108 of FIG. 8).

The rail displacement unit 105a then determines that the transportation device 220 does not transport a plurality of boards in parallel (NO in S108 of FIG. 8) since the transportation device 220 transports the single board 23. Thus, the rail displacement unit 105a positions the rails so that the center of the mounting area in the forward-backward direction is at the intermediate position between the two component supply units 211a and 211b (S112 of FIG. 8).

Specifically, the rail displacement unit 105a causes the displacement mechanisms 231 and 232 to displace the respective rails 221a and 221b in the forward-backward direction (in the Y-axis direction shown in FIG. 9A) so that the center position of the length of the board 23 in the forward-backward direction moves to the intermediate position between the two component supply units 211a and 211b.

Furthermore, the rail displacement unit 105a causes the displacement mechanisms 233 and 234 to displace the respective rails 222a and 222b in the forward-backward direction so that the rails 222a and 222b will not interfere with the rails 221a and 221b.

By so doing, the rail displacement unit 105a performs a four-axis-independent control in which four displacement mechanisms, that is, the displacement mechanisms 231 to 234, are controlled independently.

The control unit 105b then controls operations of the two mounting heads 213a and 213b so that the two mounting heads 213a and 213b alternately mount the components in the mounting area on the board 23 (S114 of FIG. 8).

Furthermore, as shown in FIG. 9B, the rail displacement unit 105a obtains, as the transportation rail, the rails 221b and 222a on which the board 23 is transported, and obtains the rail information with the inner rail "absent" (S102 of FIG. 8). Each of the rails 221b and 222a is provided with transportation belts on both sides in the forward-backward direction so that a board can be transported on either side in the forward-backward direction.

The rail displacement unit 105a then determines that the inner rail is absent (NO in S104 of FIG. 8) and determines that the transportation device 220 does not transport a plurality of boards in parallel (NO in S108 of FIG. 8), which results in positioning of the rails so that the center of the mounting area in the forward-backward direction is at the intermediate position between the two component supply units 211a and 211b (S112 of FIG. 8).

Specifically, the rail displacement unit 105a causes the displacement mechanisms 232 and 233 to displace the respective rails 221b and 222a in the forward-backward direction (in the Y-axis direction shown in FIG. 9B) so that the center position of the length of the board 23 in the forward-backward direction moves to the intermediate position between the two component supply units 211a and 211b. Here, the displacement mechanisms 232 and 233 are a single-axis control mechanism such that they move in the forward-backward direction equally from the intermediate position between the component supply units 211a and 211b.

Furthermore, the rail displacement unit 105a causes the displacement mechanisms 231 and 234 to displace the respective rails 221a and 222b in the forward-backward direction so that the rails 221a and 222b will not interfere with the rails 221b and 222a.

Thus, the rail displacement unit 105a performs a three-axis-independent control in which three mechanisms, that is, a mechanism for controlling the displacement mechanisms 232 and 233, a mechanism for controlling the displacement mechanism 231, and a mechanism for controlling the displacement mechanism 234, are controlled independently.

The control unit 105b then controls operations of the two mounting heads 213a and 213b so that the two mounting heads 213a and 213b alternately mount the components in the mounting area on the board 23 (S114 of FIG. 8).

Figure 10A:
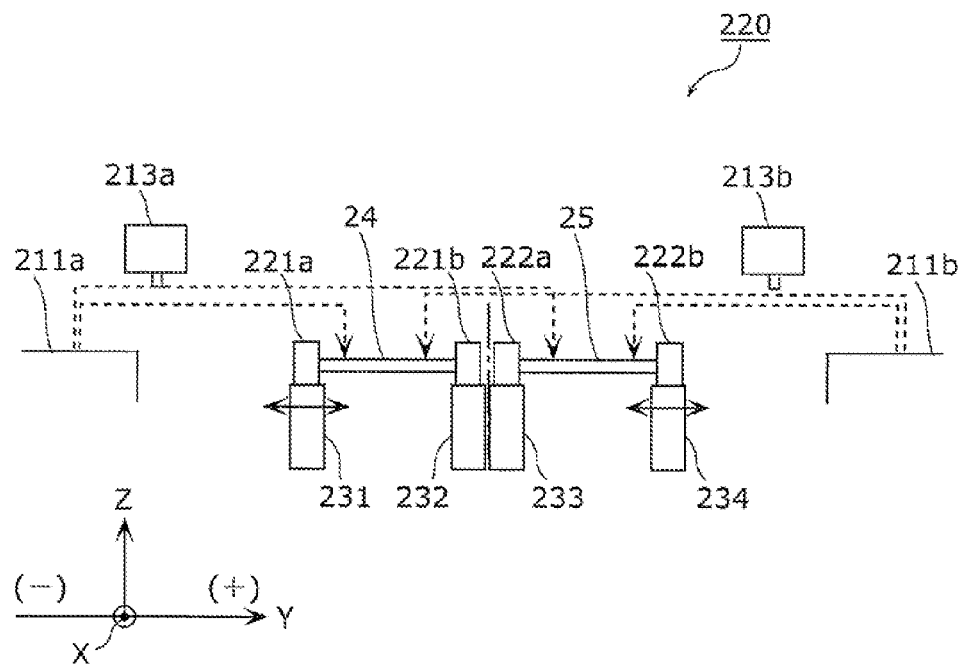
FIG. 10A explains a process which the control device according to the first embodiment performs.
Figure 10B:
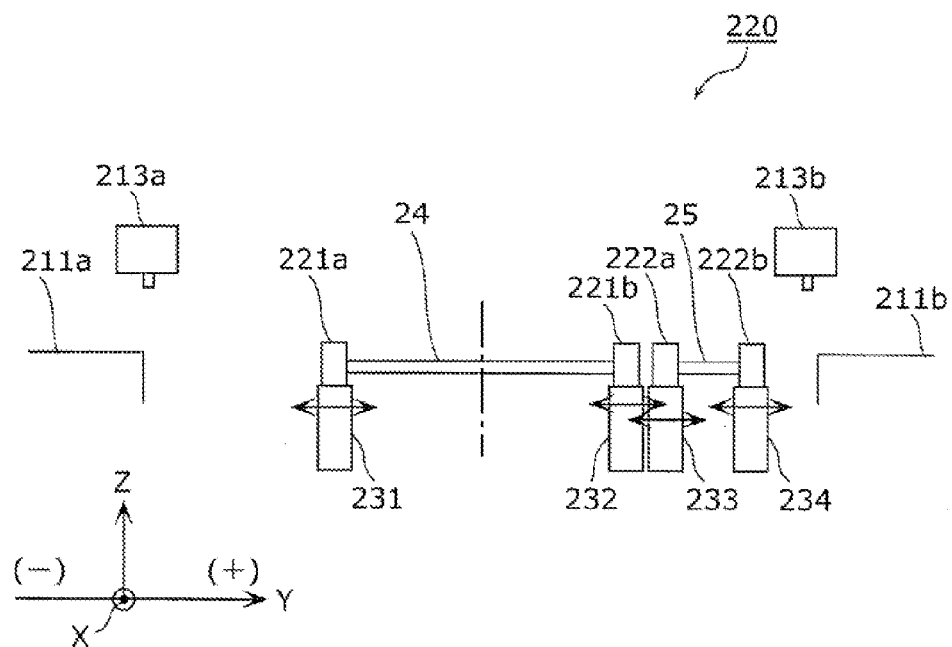
FIG. 10B explains a process which the control device according to the first embodiment performs.

Specifically, FIGS. 10A and 10B each explain the process which the control device 100 performs when the inner rail is absent (NO in Step S104 of FIG. 8) and a plurality of boards are transported in parallel (YES in S108 of FIG. 8).

First, the rail displacement unit 105a obtains the rail information with reference to the rail determination data 107b (S102 of FIG. 8). Specifically, as shown in FIG. 10A, the rail displacement unit 105a obtains, as the transportation rail, the rails 221a and 221b on which a board 24 is transported, and the rails 222a and 222b on which a board 25 is transported. The rail displacement unit 105a obtains the rail information with the inner rail "absent".

The rail displacement unit 105a then determines whether the inner rail is present or absent (S104 of FIG. 8) and determines that the inner rail is absent (NO in S104 of FIG. 8). Thus, the rail displacement unit 105a determines whether or not the transportation device 220 transports a plurality of boards in parallel (S108 of FIG. 8).

The rail displacement unit 105a then determines that the transportation device 220 transports a plurality of boards in parallel (YES in S108 of FIG. 8) since the transportation device 220 transports the two boards 24 and 25.

Thus, the rail displacement unit 105a positions the boards close to each other in the forward-backward direction so as to reduce the size of the mounting area (S110 of FIG. 8), and positions the rails so that the center of the mounting area in the forward-backward direction is at the intermediate position between the two component supply units 211a and 211b (S112 of FIG. 8).

Specifically, the rail displacement unit 105a causes the displacement mechanisms 231 to 234 to displace the respective rails 221a to 222b in the forward-backward direction (in the Y-axis direction shown in FIG. 10A) so that the boards 24 and 25 are positioned close to each other and the center position of the length, in the forward-backward direction, of the mounting area including the boards 24 and 25 moves to the intermediate position between the two component supply units 221a and 211b.

It is to be noted that the center position of the mounting area in the forward-backward direction here is the center position of the length, in the forward-backward direction, of the mounting area on a single board in the case where the boards 24 and 25 are regarded as the single board. This means that, as shown in FIG. 10A, when the boards 24 and 25 have the same length in the forward-backward direction, the center position in the forward-backward direction of the boards 24 and 25 is the center position of the mounting area in the forward-backward direction.

Here, in the case where the rails 222b and 222a are fixed, the rail displacement unit 105a performs a two-axis-independent control in which the two displacement mechanisms, that is, the displacement mechanisms 231 and 234, are controlled independently.

The control unit 105b then controls operations of the two mounting heads 213a and 213b so that the two mounting heads 213a and 213b alternately mount the components in the mounting area over the boards 24 and 25 (S114 of FIG. 8).

It is to be noted that, as shown in FIG. 10B, the center position of the mounting area in the forward-backward direction may be the center position of the length, in the forward-backward direction, of a board having the longest length in the forward-backward direction among two or more boards to be transported in parallel. Specifically, since the board 24 is longer than the board 25 as seen in the forward-backward direction, the center position of the mounting area in the forward-backward direction is the center position of the length of the board 24 in the forward-backward direction.

Thus, the rail displacement unit 105a causes the displacement mechanisms 231 to 234 to displace the respective rails 221a to 222b so that the boards 24 and 25 are positioned close to each other and the center position of the length of the board 24 in the forward-backward direction moves to the intermediate position between the two component supply units 221a and 211b.

The center position of the mounting area in the forward-backward direction may be a position determined by averaging the coordinates, in the forward-backward direction, of part or all of the mounting points on a board with the largest number of mounting points among two or more boards to be transported in parallel.

With this, the rails can be appropriately positioned according to the size of the board to be transported, the number of mounting points, and the like.

Figure 11A:
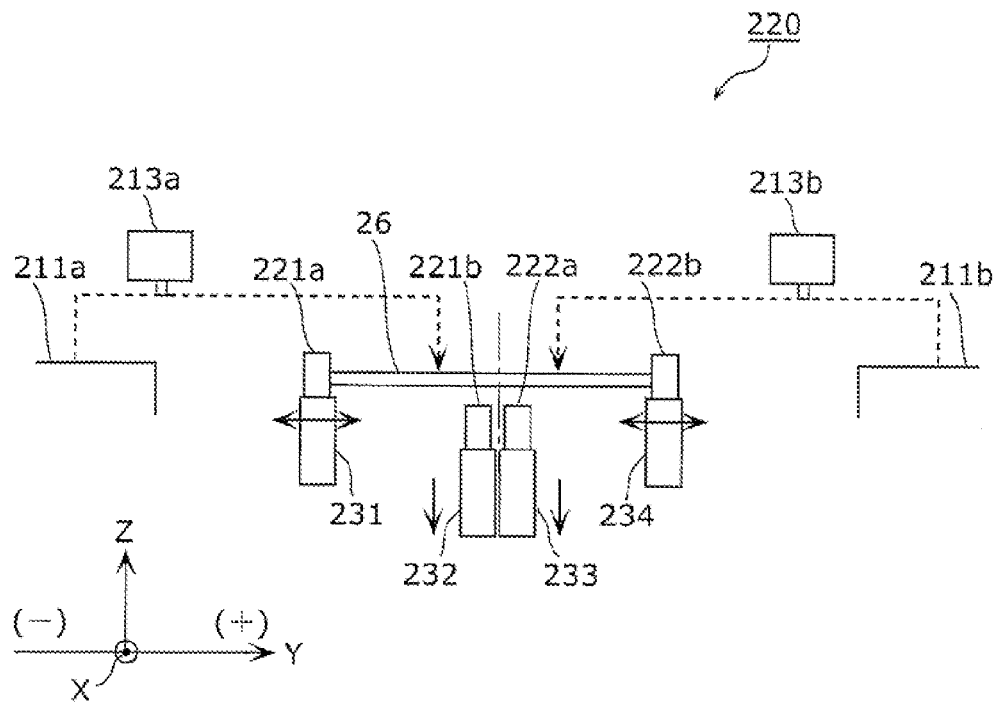
FIG. 11A explains a process which the control device according to the first embodiment performs.
Figure 11B:
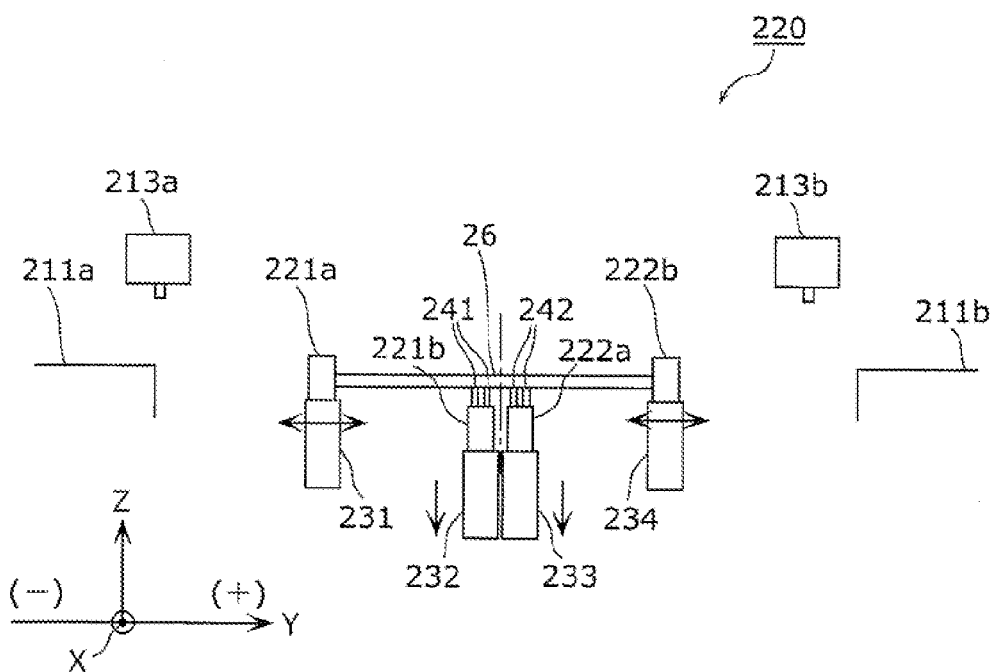
FIG. 11B explains a process which the control device according to the first embodiment performs.

Specifically, FIGS. 11A and 11B each explain the process which the control device 100 performs when the inner rail is present (YES in Step S104 of FIG. 8) and a plurality of boards are not transported in parallel (NO in S108 of FIG. 8).

First, the rail displacement unit 105a obtains the rail information with reference to the rail determination data 107b (S102 of FIG. 8). Specifically, as shown in FIG. 11A, the rail displacement unit 105a obtains, as the transportation rail, the rails 221a and 221b on which a board 26 is transported. Furthermore, the rail displacement unit 105a obtains, as the inner rail, the rails 221b and 222a that are positioned between the rail 221a and the rail 221b.

The rail displacement unit 105a then determines whether the inner rail is present or absent (S104 of FIG. 8) and determines that the inner rail is present (S104 of FIG. 8), therefore lowering the inner rails, that is, the rails 221b and 222a (S106 of FIG. 8). The rail displacement unit 105a then determines whether or not the transportation device 220 transports a plurality of boards in parallel (S108 of FIG. 8).

The rail displacement unit 105a then determines that the transportation device 220 does not transport a plurality of boards in parallel (NO in S108 of FIG. 8) since the transportation device 220 transports the single board 23. Thus, the rail displacement unit 105a positions the rails so that the center of the mounting area in the forward-backward direction is at the intermediate position between the two component supply units 211a and 211b (S112 of FIG. 8).

Specifically, the rail displacement unit 105a causes the displacement mechanisms 231 and 234 to displace the respective rails 221a and 222b in the forward-backward direction (in the Y-axis direction shown in FIG. 11A) so that the center position of the length of the board 26 in the forward-backward direction moves to the intermediate position between the two component supply units 211a and 211b. Here, the displacement mechanisms 231 and 234 are a single-axis control mechanism such that they move in the forward-backward direction equally from the intermediate position between the component supply units 211a and 211b.

By so doing, the rail displacement unit 105a performs a two-axis-independent control in which two displacement mechanisms, that is, a mechanism for controlling the displacement mechanisms 231 and 234 and a mechanism for lowering the displacement mechanisms 232 and 233, are controlled independently.

The control unit 105b then controls operations of the two mounting heads 213a and 213b so that the two mounting heads 213a and 213b alternately mount the components in the mounting area on the board 26 (S114 of FIG. 8).

Furthermore, as shown in FIG. 11B, the rails 221b and 222a each of which serves as the inner rail may have, on top thereof, respective support pins 241 and 242 that support the lower surface of the board 26 from below.

Specifically, the rail displacement unit 105a causes the displacement mechanisms 232 and 233 to lower the respective rails 221b and 222a each of which serves as the inner rail, at the position at which the respective support pins 241 and 242 support the lower surface of the board 26 from below.

The rail displacement unit 105a then positions the two rails on which the board is transported, so as to position the board 26 across the rails 221b and 222a each of which serves as the inner rail between the rails 221a and 222b and so that the support pins 241 and 242 can support the lower surface of the board 26 from below.

The control unit 105b then controls operations of the two mounting heads 213a and 213b so that the support pins 241 and 242 disposed on the inner rails raised by the respective displacement mechanisms 232 and 233 support the lower surface of the board 26 from below while the two mounting heads 213a and 213b are alternately mounting the components in the mounting area on the board 26 (S114 of FIG. 8).

As above, the component mounting apparatus 200 according to the first embodiment positions the rails so that the center of the mounting area in the forward-backward direction is at the intermediate position between the two component supply units 211a and 211b from which the components are then alternately mounted in the mounting area. This equalizes the distances from the two component supply units 211a and 211b to the mounting area. In other words, this equalizes the distances over which the two mounting heads 213a and 213b move to mount the components onto the board after picking up the components from the component supply units 211a and 211b, with the result that the waiting time of the mounting heads in alternately mounting the components onto the board is reduced. Thus, the mounting time loss in alternately mounting the components onto the board can be reduced despite the presence of a plurality of rails on which a plurality of boards can be transported in parallel.

Furthermore, in the case where two or more boards are transported in parallel, the two or more boards are positioned close to each other in the forward-backward direction so as to reduce the size of the mounting area, and the rails are positioned so that the center of the mounting area in the forward-backward direction is at the intermediate position between the two component supply units 211a and 211b. This means that converging the mounting area at the intermediate position between the component supply units 211a and 211b reduces an area which is included in the mounting area and where the two mounting heads 213a and 213b move over different distances to mount the components onto the board after picking up the components from the component supply units 211a and 211b. The waiting time of the mounting heads is therefore reduced in alternately mounting the components onto the board.

Furthermore, at least one of the rails on which the boards are transported is displaced in the forward-backward direction to position the rails. Thus, displacing the rails in the forward-backward direction allows the rails to be positioned, and the mounting time loss in alternately mounting the components onto the board can be reduced.

Furthermore, the rails are positioned by lowering the inner rail so that the board is positioned across the inner rail between the two rails. Thus, lowering the inner rail allows the board to be positioned.

Furthermore, the rails are positioned with the inner rail lowered by the displacement mechanism so that the support pin supports the board. In other words, it is possible that the board is supported from below by the support pin while the components are being mounted in the mounting area. Thus, the inner rail can be used as a support for supporting the board from below.

Second Embodiment

In the second embodiment, the transportation device 220 further includes a conveyor which carries the board in and out and is displaceable in the forward-backward direction. Details are described below.

Figure 12:
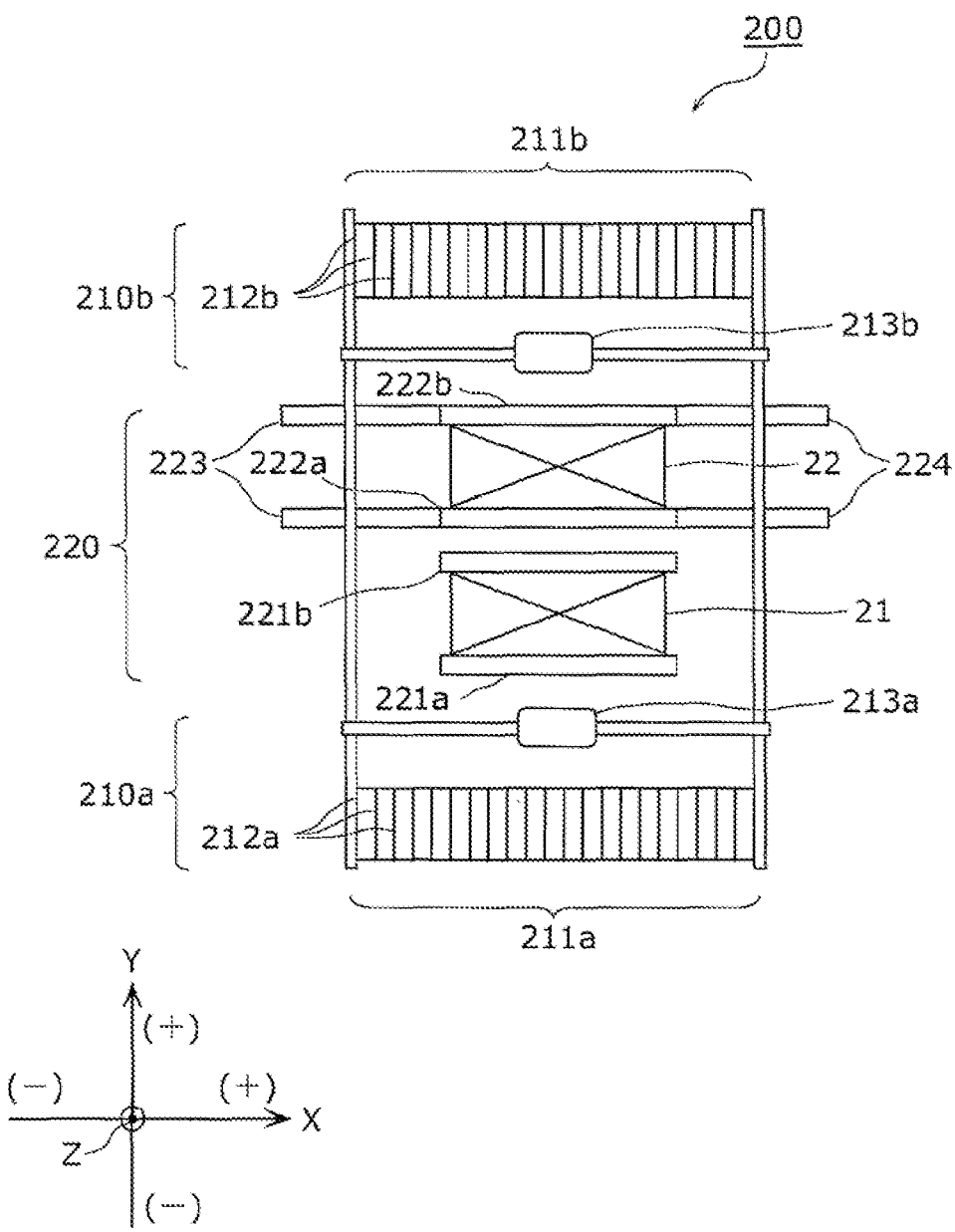
FIG. 12 is a plan view showing a primary internal structure of a component mounting apparatus according to the second embodiment.

FIG. 12 is a plan view showing a primary internal structure of the component mounting apparatus 200 according to the second embodiment. Here, like in FIG. 2, the X-axis direction represents a direction in which the board is transported, and the Y-axis direction represents the forward-backward direction of the component mounting apparatus 200, which is orthogonal to the X-axis direction on the horizontal plane.

As shown in FIG. 12, the component mounting apparatus 200 includes, like in FIG. 2, the two mounting units 210a and 210b and the transportation 220, and the transportation 220 includes a carry-in conveyor 223 and a carry-out conveyor 224 in addition to the rails 221a to 222b. Here, the components other than the carry-in conveyor 223 and the carry-out conveyor 224 are the same or alike as those in FIG. 2 and therefore not described in detail. It is to be noted that "board carry-in/out conveyor" in CLAIMS corresponds to the carry-in conveyor 223 and the carry-out conveyor 224.

The carry-in conveyor 223 is a conveyor displaceable in the forward-backward direction, which carries one board, among the plurality of boards to be transported, onto the two rails on which the one board is transported. Specifically, the carry-in conveyor 223 is displaced in the forward-backward direction to carry the board 21 onto the rails 221a and 221b and carry the board 22 onto the rails 222a and 222b.

The carry-out conveyor 224 is a conveyor displaceable in the forward-backward direction, which carries one board out, among the plurality of boards to be transported, from the two rails on which the one board is transported. Specifically, the carry-out conveyor 224 is displaced in the forward-backward direction to carry the board 21 out from the rails 221a and 221b and carry the board 22 out from the rails 222a and 222b.

Figure 13:
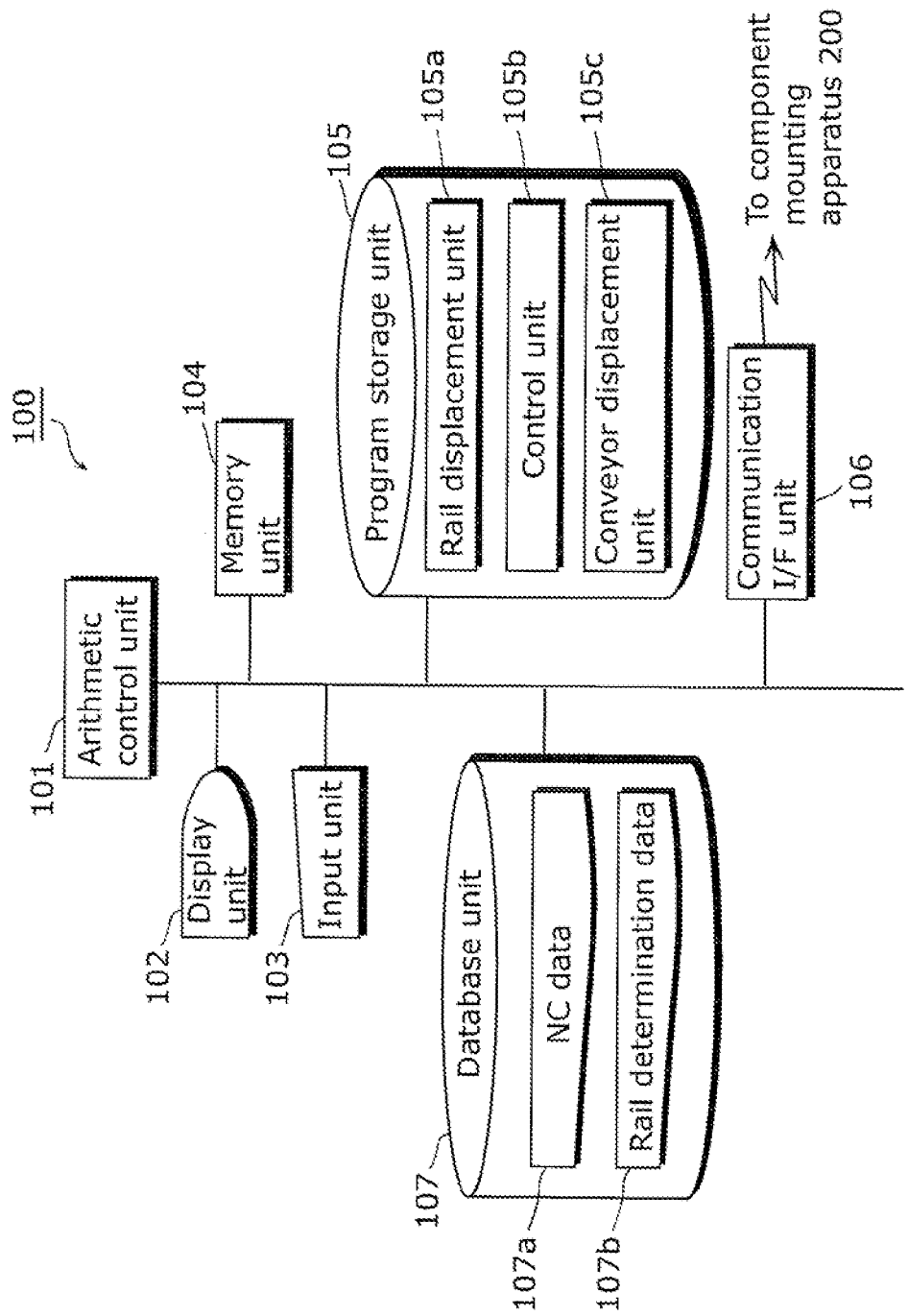
FIG. 13 is a block diagram showing a functional structure of a control device according to the second embodiment.

FIG. 13 is a block diagram showing a functional structure of the control device 100 according to the second embodiment.

As shown in FIG. 13, the control device 100 includes a conveyor displacement unit 105c in the program storage unit 105, in addition to the functional structure of the control device 100 according to the first embodiment shown in FIG. 5. Here, the other part of the structure is the same or alike as that shown in FIG. 5 and therefore not described in detail.

The conveyor displacement unit 105c displaces the carry-in conveyor 223 in the forward-backward direction to cause the carry-in conveyor 223 to carry one board in, while the components are being mounted in the mounting area on another board different from the one board under control of the control unit 105b. Furthermore, the conveyor displacement unit 105c displaces the carry-out conveyor 224 in the forward-backward direction to cause the carry-out conveyor 224 to carry one board out, while the components are being mounted in the mounting area on another board different from the one board under control of the control unit 105b.

Next, a process which the control unit 100 performs is described.

Figure 14:
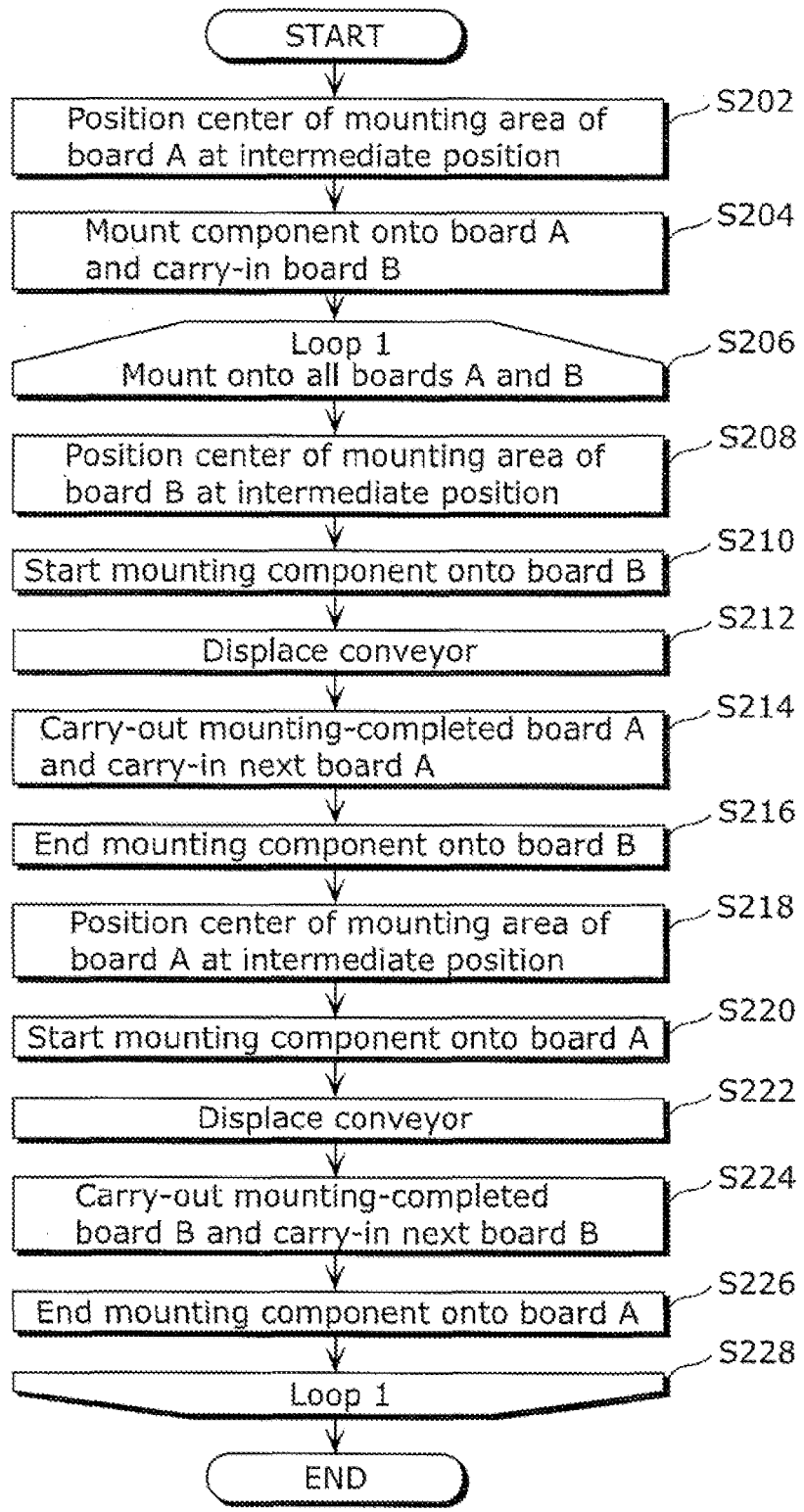
FIG. 14 is a flowchart showing an example of operation of the control device according to the second embodiment.
Figure 15:
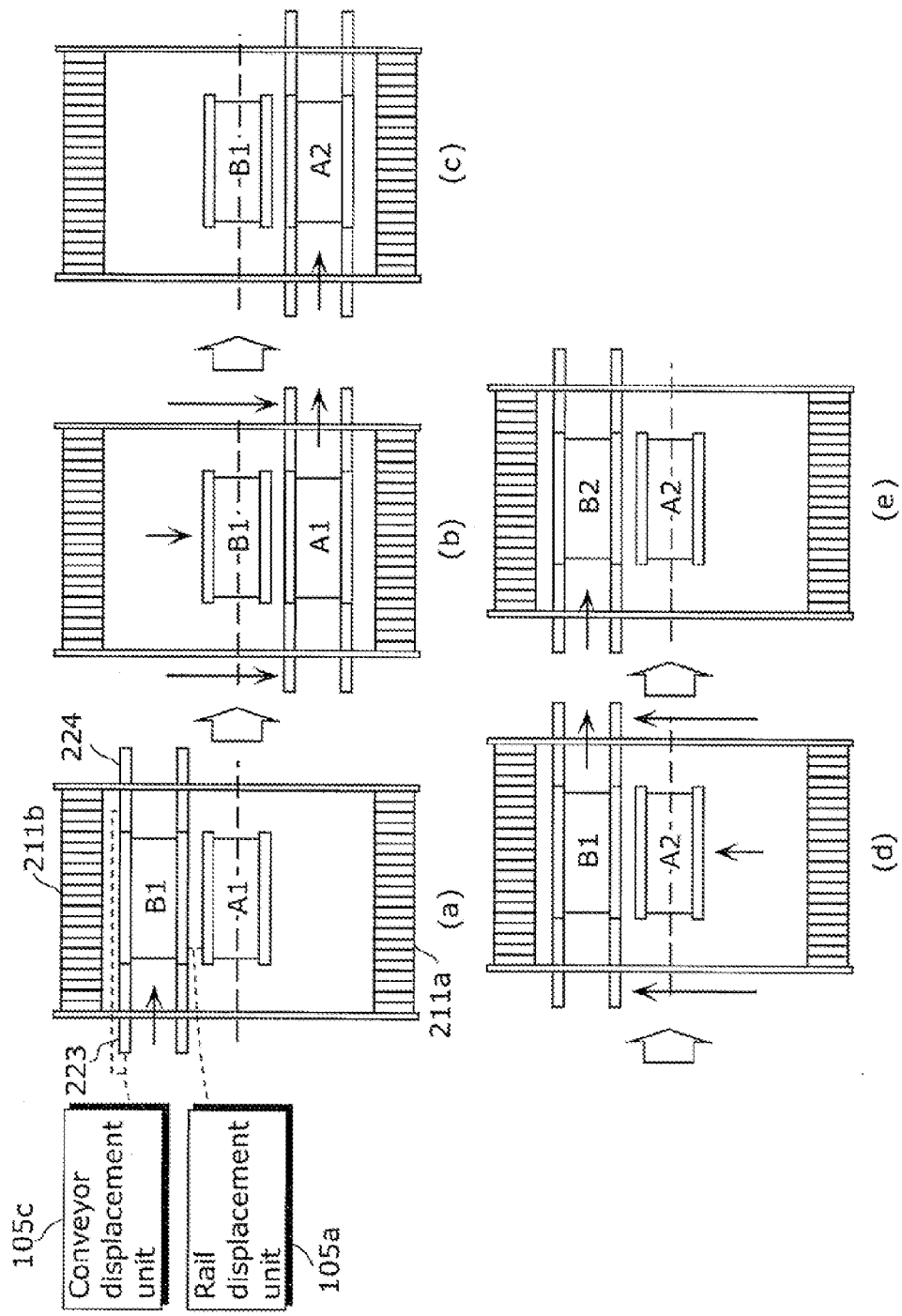
FIG. 15 explains an example of operation of the control device according to the second embodiment.
Figure 16A:
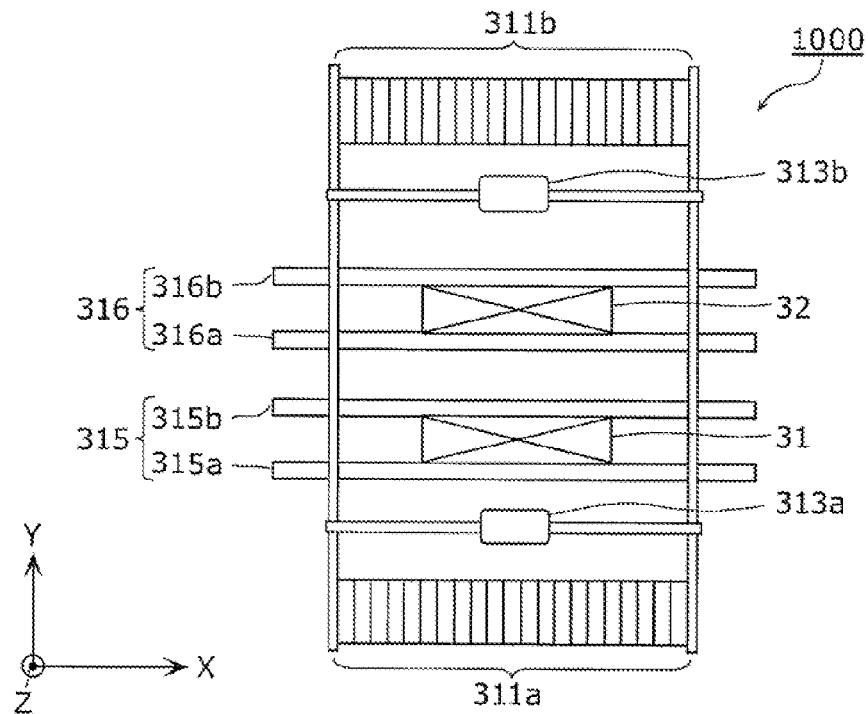
FIG. 16A explains a mounting time loss occurring when a conventional component mounting apparatus alternately mounts components onto a board.
Figure 16B:
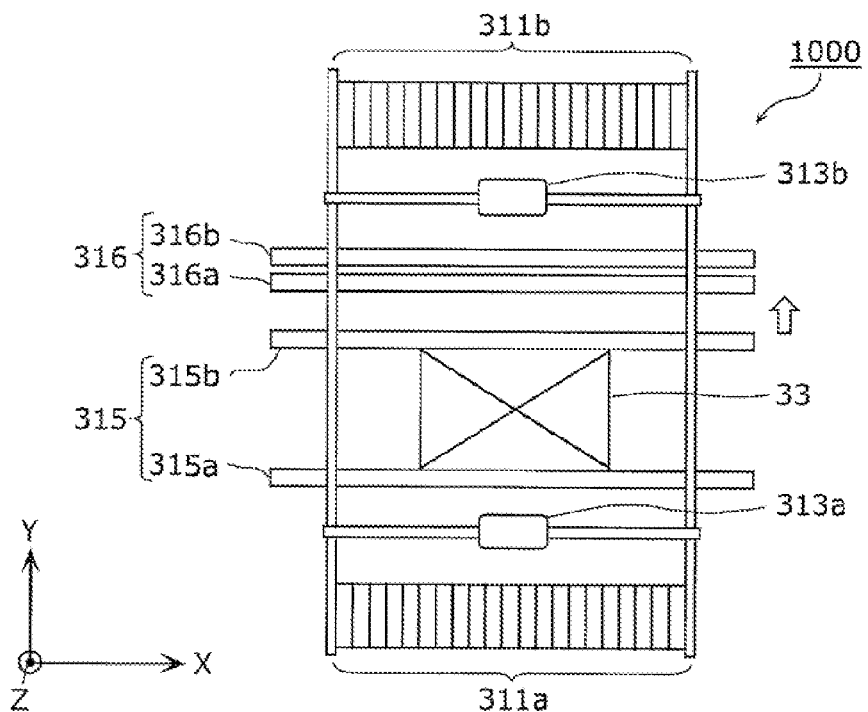
FIG. 16B explains a mounting time loss occurring when a conventional component mounting apparatus alternately mounts components onto a board.

FIG. 14 is a flowchart showing an example of operation of the control device 100 according to the second embodiment. FIG. 15 explains an example of operation of the control device 100 according to the second embodiment.

As shown in FIG. 14, first, the rail displacement unit 105a positions the center, in the forward-backward direction, of the mounting area on the board 21 of board type A (hereinafter referred to as board A), at the intermediate position between the two component supply units 211a and 211b (S202). Details on this process of positioning the center of the mounting area in the forward-backward direction are the same or alike as in the first embodiment (S102 to S112 of FIG. 8) and therefore not described.

The conveyor displacement unit 105c then causes the carry-in conveyor 223 to carry in the board 22 of board type B (hereinafter referred to as board B), while the components are being mounted in the mounting area on the board A under control of the control unit 105b.

Specifically, as shown in (a) of FIG. 15, the rail displacement unit 105a positions the center, in the forward-backward direction, of the mounting area on a board A1 that is the board A, at the intermediate position between the component supply units 211a and 211b. The conveyor displacement unit 105c then causes the carry-in conveyor 223 to carry in a board B1 that is the board B, while the components are being mounted in the mounting area on the board A1 under control of the control unit 105b.

With reference back to FIG. 14, the following process (Loop 1: S206 to S228) is repeatedly performed next, until all the boards A and B have the components mounted thereon.

First, the rail displacement unit 105a positions the center, in the forward-backward direction, of the mounting area on the board B, at the intermediate position between the component supply units 211a and 211b (S208).

The control unit 105b then starts mounting the components onto the board B (S210).

The conveyor displacement unit 105c displaces the carry-in conveyor 223 and the carry-out conveyor 224 in the forward-backward direction so that the board A can be carried in and out (S212).

Specifically, as shown in (b) of FIG. 15, the rail displacement unit 105a positions the center, in the forward-backward direction, of the mounting area on the board B1, at the intermediate position between the component supply units 211a and 211b. The control unit 105b then starts mounting the components onto the board B1.

The conveyor displacement unit 105c then displaces the carry-out conveyor 224 in the forward-backward direction so that the board A1 can be carried out, and displaces the carry-in conveyor 223 in the forward-backward direction so that a board A2 that is a board of board type A which follows the board A1 can be carried in.

With reference back to FIG. 14, the conveyor displacement unit 105c then carries the board A out on which the components have been mounted, and carries the next board A in (S214).

Specifically, as shown in (c) of FIG. 15, the conveyor displacement unit 105c causes the carry-out conveyor 224 to carry the board A1 out, and causes the carry-in conveyor 223 to carry in the board A2 that is a board which follows the board A1.

With reference back to FIG. 14, the control unit 105b ends the mounting the components onto the board B (S216).

The rail displacement unit 105a then positions the center, in the forward-backward direction, of the mounting area on the board A, at the intermediate position between the component supply units 211a and 211b (S218).

The control unit 105b then starts mounting the components onto the board A (S220).

The conveyor displacement unit 105c then displaces the carry-in conveyor 223 and the carry-out conveyor 224 in the forward-backward direction so that the board B can be carried in and out (S222).

Specifically, as shown in (d) of FIG. 15, the rail displacement unit 105a positions the center, in the forward-backward direction, of the mounting area on the board A2, at the intermediate position between the component supply units 211a and 211b. The control unit 105b then starts mounting the components onto the board A2.

The conveyor displacement unit 105c then displaces the carry-out conveyor 224 in the forward-backward direction so that the board B1 can be carried out, and displaces the carry-in conveyor 223 in the forward-backward direction so that the board B2 that is a board of board type B which follows the board B1 can be carried in.

With reference back to FIG. 14, the conveyor displacement unit 105c then carries the board B out on which the components have been mounted, and carries the next board B in (S224).

Specifically, as shown in (e) of FIG. 15, the conveyor displacement unit 105c causes the carry-out conveyor 224 to carry the board B1 out, and causes the carry-in conveyor 223 to carry in the board B2 that is a board which follows the board B1.

With reference back to FIG. 14, the control unit 105b ends mounting the components onto the board A (S226).

As above, completion of mounting the components onto all the boards A and B (Loop 1: S206 to S228) ends the process which the control device 100 performs.

In other words, while the components are being mounted onto the board, the conveyor is displaced in the forward-backward direction so that the conveyor carries in or out another board which is transported in parallel. This allows another board to be carried in or out while the components are being mounted onto the board, with the result that the time loss caused by carrying a board in or out can be reduced. Thus, not only the mounting time loss in alternately mounting the components onto the board can be reduced, but also the carry-in or -out time loss can be reduced.

While the component mounting apparatus 200 according to an aspect of the present invention has been described so far in the above embodiments, the present invention is not limited to the above description.

That is, the embodiments disclosed herein shall be considered in all aspects as illustrative and not restrictive. The scope of the present invention is indicated by the claims rather than the foregoing description and intended to cover all modifications within the scope of the claims and their equivalents.

For example, in the present embodiments, the component mounting apparatus 200 is configured to transport the boards of the same type onto the same rail to mount the components onto the boards. However, the component mounting apparatus 200 may be configured to alternately transport boards of different board types to mount the components onto the boards. For example, in the case of mounting onto a board having two sides of different board types, alternately mounting the components onto the two sides of the board allows a reduction in the number of intermediate stocks.

Furthermore, while the transportation device 220 includes the two pairs of the rails on which the two boards can be transported in parallel in the present embodiments, the transportation device 220 may include three or more pairs of the rails.

Furthermore, in the present embodiments, the control device 100 is configured to cause the displacement mechanism to lower the inner rail. However, the inner rail may be lowered by means of a manual operation by an operator.

Furthermore, in the present embodiments, the rail displacement unit 105a is configured to obtain the rail information with reference to the rail determination data 107b. However, the rail displacement unit 105a may obtain the rail information by means of a data input by an operator.

Furthermore, in the present embodiments, the control unit 100 stores the rail determination data 107b in which the type of the board to be transported is associated with the transportation rail for transporting the board as well as the inner rail. However, the control device 100 may store the rail determination data 107b in which the width of the board to be transported is associated with the transportation rail and the inner rail.

Furthermore, in the present embodiments, the rail displacement unit 105a positions the rails by displacing the rails in the forward-backward direction (in the Y-axis direction shown in FIG. 3) so that the center of the mounting area in the forward-backward direction is at the intermediate position between the two component supply units 211a and 211b. However, if the center of the mounting area in the forward-backward direction can be positioned at the intermediate position even with the rails not displaceable in the forward-backward direction, it is also possible that the rails are configured not to be displaced in the forward-backward direction.

Furthermore, in the present embodiments, the rail displacement unit 105a is configured to position the rails so that the center of the mounting area in the forward-backward direction is at the intermediate position between the two component supply units 211a and 211b which position is equally distant in the forward-backward direction from the two component supply units 211a and 211b. That is, the intermediate position between the two component supply units 211a and 211b is set to be the intermediate position in the length, in the forward-backward direction, between the two component supply units 211a and 211b. However, the intermediate position between the two component supply units 211a and 211b may be defined as the average position of the mounting points in the forward-backward direction inside the mounting area. The average position is tolerated in the range of plus and minus 10 percent in the forward-backward direction, for example.

Furthermore, in the present embodiments, the component mounting apparatus 200 is configured as a component mounting apparatus of alternate punching. However, the component mounting apparatus 200 does not always need to perform alternate punching and therefore a component mounting apparatus which performs alternate punching only when necessary is sufficient.

Furthermore, the present invention can be implemented not only as the component mounting apparatus 200 as above, but also as the transportation device 220 included in the component mounting apparatus 200. Furthermore, the present invention can be implemented as a component mounting method including, as steps, the process which the control device 100 performs, and can also be implemented as a program and an integrated circuit which cause a computer to execute such characteristic steps. In addition, it goes without saying that such a program may be distributed via a recording medium such as a CD-ROM and a communication network such as the Internet.

INDUSTRIAL APPLICABILITY

The present invention is applicable to a component mounting apparatus which includes a transportation device having a plurality of rails on which a plurality of boards can be transported in parallel, and particularly applicable to a component mounting apparatus or the like which is capable of reducing a mounting time loss in alternately mounting components onto the board.

REFERENCE SIGNS LIST

10 Component mounting system
20-26, 31-33 Board
100 Control device
101 Arithmetic control unit
102 Display unit
103 Input unit
104 Memory unit
105 Program storage unit
105a Rail displacement unit
105b Control unit
105c Conveyor displacement unit
106 Communication I/F unit
107 Database unit
107a NC data
107b Rail determination data
200, 1000 Component mounting apparatus
210a, 210b Mounting unit
211a, 211b, 311a, 311b Component supply unit
212a, 212b Component feeder
213a, 213b, 313a, 313b Mounting head
220 Transportation device
221a, 221b, 222a, 222b, 315a, 315b, 316a, 316b Rail
223 Carry-in conveyor
224 Carry-out conveyor
231, 232, 233, 234 Displacement mechanism
241, 242 Support pin
300 Printing device
315, 316 Transportation lane
400 Inspection device
500 Adhesive applicator
600 Reflow furnace

The invention claimed is:

1. A component mounting method, comprising:
arranging a component mounting apparatus for mounting components onto a plurality of boards, the component mounting apparatus including:
a board transportation device having a plurality of rails in parallel and being configured to transport, in parallel, the plurality of boards onto which the components are mounted, the plurality of rails being positioned in a first direction orthogonal to a second direction in which the board transportation device is configured to transport the plurality of boards;
two mounting heads capable of alternately mounting the components onto the plurality of boards which are transported by the board transportation device; and
two component supply units disposed across the board transportation device in the first direction and supplying the two mounting heads with the components;
positioning the rails by displacing the rails in the first direction so that a center of a mounting area in the first direction is at an intermediate position between corresponding parts of the two component supply units, the mounting area covering an area in which the two mounting heads mount the components on one or more of the plurality of boards which are transported by the board transportation device, and the intermediate position being equally distant in the first direction from the two component supply units; and alternately mounting the components on a same one of the plurality of boards in the mounting area between the two mounting heads at a one for one frequency alternation.

2. The component mounting method according to claim 1, wherein in said positioning, when two or more of the plurality of boards are transported in parallel, the two or more of the plurality of boards are positioned adjacent to each other in the first direction so as to reduce a size of the mounting area including at least an area on the two or more of the plurality of boards in which the components are mounted, and the rails are positioned so that the center of the mounting area in the first direction is at the intermediate position between the corresponding parts of the two component supply units.

3. The component mounting method according to claim 1, wherein in said positioning, the rails are positioned by displacing, in the first direction, at least two of the rails on which the board is transported, so that the center of the mounting area in the first direction is at the intermediate position between the corresponding parts of the two component mounting supply units.

4. The component mounting method according to claim 1, further comprising
raising and lowering an inner rail that is positioned between two of the rails on which the one of the plurality of boards is transported,
wherein in said positioning, the rails are positioned so as to position the one of the plurality of boards across the inner rail between the two rails.

5. The component mounting method according to claim 4, wherein in said raising and lowering, the inner rail is lowered at a position at which the inner rail supports a lower surface of the one of the plurality of boards from below,
wherein in said positioning, the two rails on which the one of the plurality of boards is transported are positioned to position the one of the plurality of boards so that the inner rail can support the lower surface of the one of the plurality of boards from below, and
wherein in said alternately mounting, the components are alternately mounted in the mounting area with the inner rail, raised in said raising and lowering, supporting the lower surface of the one of the plurality of boards from below.

6. The component mounting method according to claim 1, wherein the board transportation device further includes a board carry-in/out conveyor which carries one of the plurality of boards to be transported, onto two of the rails on which the one of the plurality of boards is transported, and carries the one of the plurality of boards out from the two rails, and
said component mounting method further includes displacing the board carry-in/out conveyor in the first direction to cause the board carry-in/out conveyor to carry the one of the plurality of boards onto the two rails or carry the one of the plurality of boards out from the two rails, while mounting the components in the mounting area on another one of the plurality of boards different from the one of the plurality of boards in said alternately mounting.

7. The component mounting method according to claim 1, wherein the mounting area includes an area in which the two mounting heads alternately mount the components on one of the plurality of boards or two or more of the plurality of boards which are transported in parallel, and
in said positioning, the rails on which the one of the plurality of boards is transported are positioned so that one of the following positions is at the intermediate position between the corresponding parts of the two component supply units: a center position of a length of the mounting area in the first direction; an average position of a plurality of mounting points in the first direction inside the mounting area; a position in the mounting area, which is located at the intermediate position in the first direction between the corresponding parts of the two component supply units when mounting time required to mount predetermined components in the mounting area is at a minimum; a center position of a length, in the first direction, of one of the plurality of boards having a longest length in the first direction among the two or more of the plurality of boards which are transported in parallel; and an average position of the mounting points in the first direction on one of the plurality of boards with a largest number of mounting points among the two or more boards.

* * * * *